(12) United States Patent
Laurent et al.

(10) Patent No.: US 11,378,225 B2
(45) Date of Patent: *Jul. 5, 2022

(54) DISPLAY SUPPORT ARM MOUNT

(71) Applicant: Apple Inc., Cupertino, CA (US)

(72) Inventors: Kristopher P. Laurent, Campbell, CA (US); Bradley J. Hamel, San Carlos, CA (US); Brett W. Degner, Menlo Park, CA (US); David H. Narajowski, San Jose, CA (US); Hao Zhu, San Jose, CA (US); Lauren M. Farrell, Mountain View, CA (US); Sunita Venkatesh, San Francisco, CA (US); Peter N. Jeziorek, San Jose, CA (US); Edward T. Sweet, San Francisco, CA (US); David A. Jungquist, Aspen, CO (US); Karen Y. Cheng, Mountain View, CA (US); Xiang Zhang, Sunnyvale, CA (US); Danny L. McBroom, Leander, TX (US); Michael D. McBroom, Leander, TX (US); Laura M. DeForest, San Mateo, CA (US)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/563,252

(22) Filed: Sep. 6, 2019

(65) Prior Publication Data

US 2020/0081483 A1 Mar. 12, 2020

Related U.S. Application Data

(60) Provisional application No. 62/855,382, filed on May 31, 2019, provisional application No. 62/728,592, filed on Sep. 7, 2018.

(51) Int. Cl.
*F16M 11/04* (2006.01)
*G06F 1/16* (2006.01)
(Continued)

(52) U.S. Cl.
CPC .......... *F16M 11/041* (2013.01); *F16M 11/06* (2013.01); *F16M 11/08* (2013.01);
(Continued)

(58) Field of Classification Search
CPC ...... G06F 1/1601; G06F 1/166; G06F 1/1654; F16M 11/041; F16M 11/06; F16M 11/08;
(Continued)

(56) References Cited

U.S. PATENT DOCUMENTS 9,010,597 B2 * 4/2015 Prescott .............. B60R 11/0252
224/547
9,146,582 B2 9/2015 Liang et al.
(Continued)

FOREIGN PATENT DOCUMENTS

CN 101680595 B 5/2012
CN 107427123 A 12/2017
(Continued)

*Primary Examiner* — Nidhi Thaker
(74) *Attorney, Agent, or Firm* — Dorsey & Whitney LLP

(57) ABSTRACT

Display assemblies for supporting displays on stands or support arms have mount portions to removably attach to the displays using magnetic assemblies and latches. The magnetic assemblies and latches can improve user experience and allow the display to be installed on a support arm from the viewing side of the display and without having to see or reach behind the display. Magnetic structures can center a mount portion of the support arm and a recess of the display and can attract them to each other. Laterally-extending latches can ensure the display is not inadvertently removed. Locking mechanisms can prevent the display from being
(Continued)

rotated to a portrait orientation when sufficient space around the display and the necessary user intent is not provided.

20 Claims, 26 Drawing Sheets

(51) Int. Cl.
*F16M 11/10* (2006.01)
*H05K 5/02* (2006.01)
*H05K 5/00* (2006.01)
*F16M 11/06* (2006.01)
*F16M 11/12* (2006.01)
*F16M 11/08* (2006.01)
*F16M 11/20* (2006.01)

(52) U.S. Cl.
CPC ............ *F16M 11/10* (2013.01); *F16M 11/105* (2013.01); *F16M 11/12* (2013.01); *G06F 1/1601* (2013.01); *G06F 1/166* (2013.01); *H05K 5/0017* (2013.01); *H05K 5/0204* (2013.01); *H05K 5/0234* (2013.01); *F16M 11/2021* (2013.01); *F16M 2200/066* (2013.01); *G06F 1/1654* (2013.01)

(58) Field of Classification Search
CPC ...... F16M 11/10; F16M 11/105; F16M 11/12; F16M 2200/066; H05K 5/0204; H05K 5/0234
See application file for complete search history.

(56) References Cited

U.S. PATENT DOCUMENTS

| | | | |
|---|---|---|---|
| 9,397,719 B1* | 7/2016 | Schmidt | F16M 11/24 |
| 9,684,336 B2 | 6/2017 | Hsu et al. | |
| 9,880,586 B2 | 1/2018 | Ent et al. | |
| 10,101,770 B2* | 10/2018 | Schatz | G06F 1/1632 |
| 10,563,683 B2* | 2/2020 | Lebovitz | F16B 11/006 |
| 10,945,673 B2* | 3/2021 | Lozano-Buhl | A61B 5/0077 |
| 2012/0267491 A1* | 10/2012 | Chiu | F16M 13/00 248/221.11 |
| 2013/0229354 A1* | 9/2013 | Whitt, III | H04M 1/0216 345/169 |
| 2013/0329360 A1* | 12/2013 | Aldana | G06F 1/1626 361/679.01 |
| 2015/0083615 A1* | 3/2015 | Lay | H04M 1/04 206/45.24 |
| 2016/0003270 A1* | 1/2016 | Franklin | F16B 1/00 439/529 |
| 2016/0051019 A1* | 2/2016 | Sirichai | H01F 7/0252 206/751 |
| 2020/0084902 A1* | 3/2020 | Venkatesh | H01F 7/0252 |

FOREIGN PATENT DOCUMENTS

| | | |
|---|---|---|
| KR | 100664323 B1 | 1/2007 |
| KR | 20110002867 U | 3/2011 |

* cited by examiner

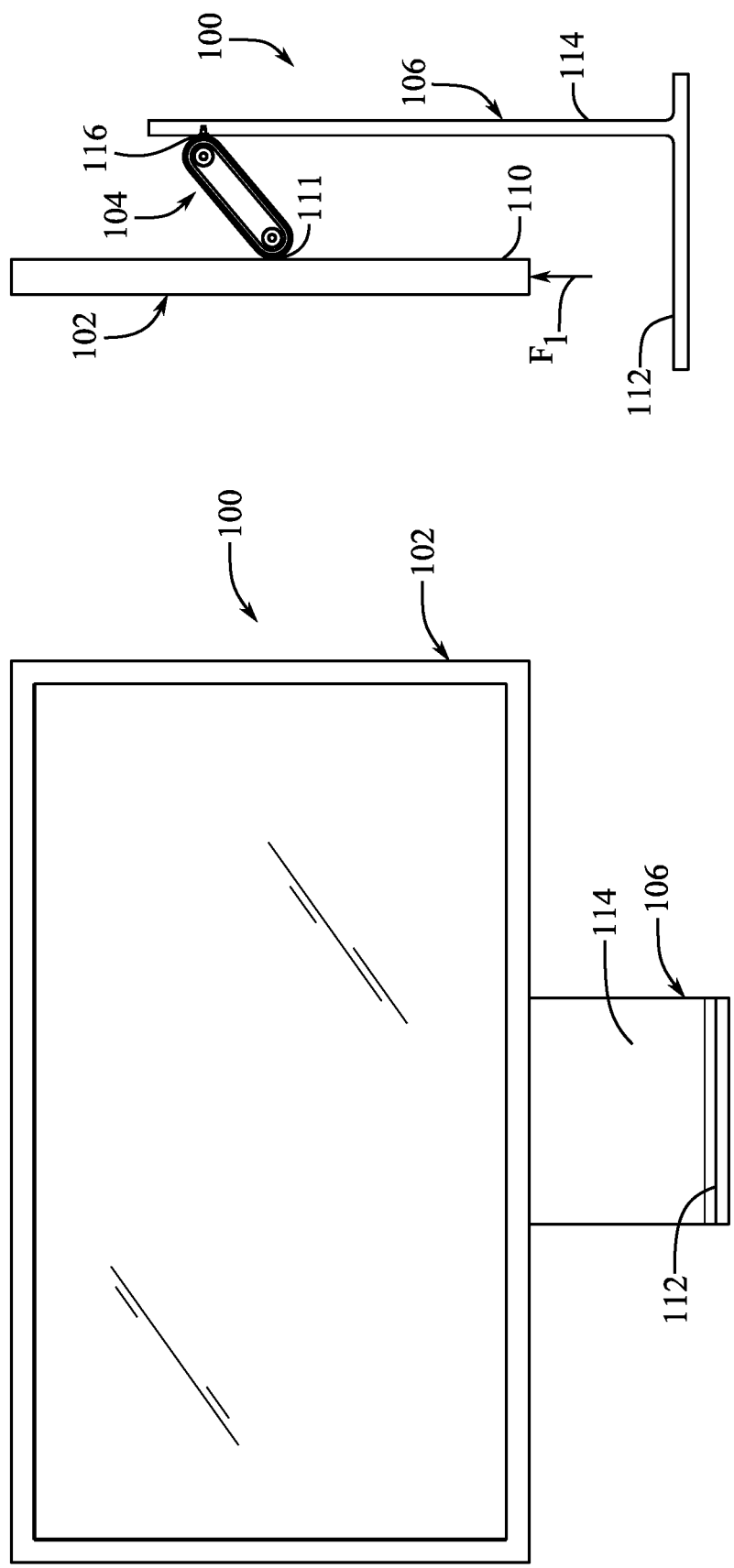

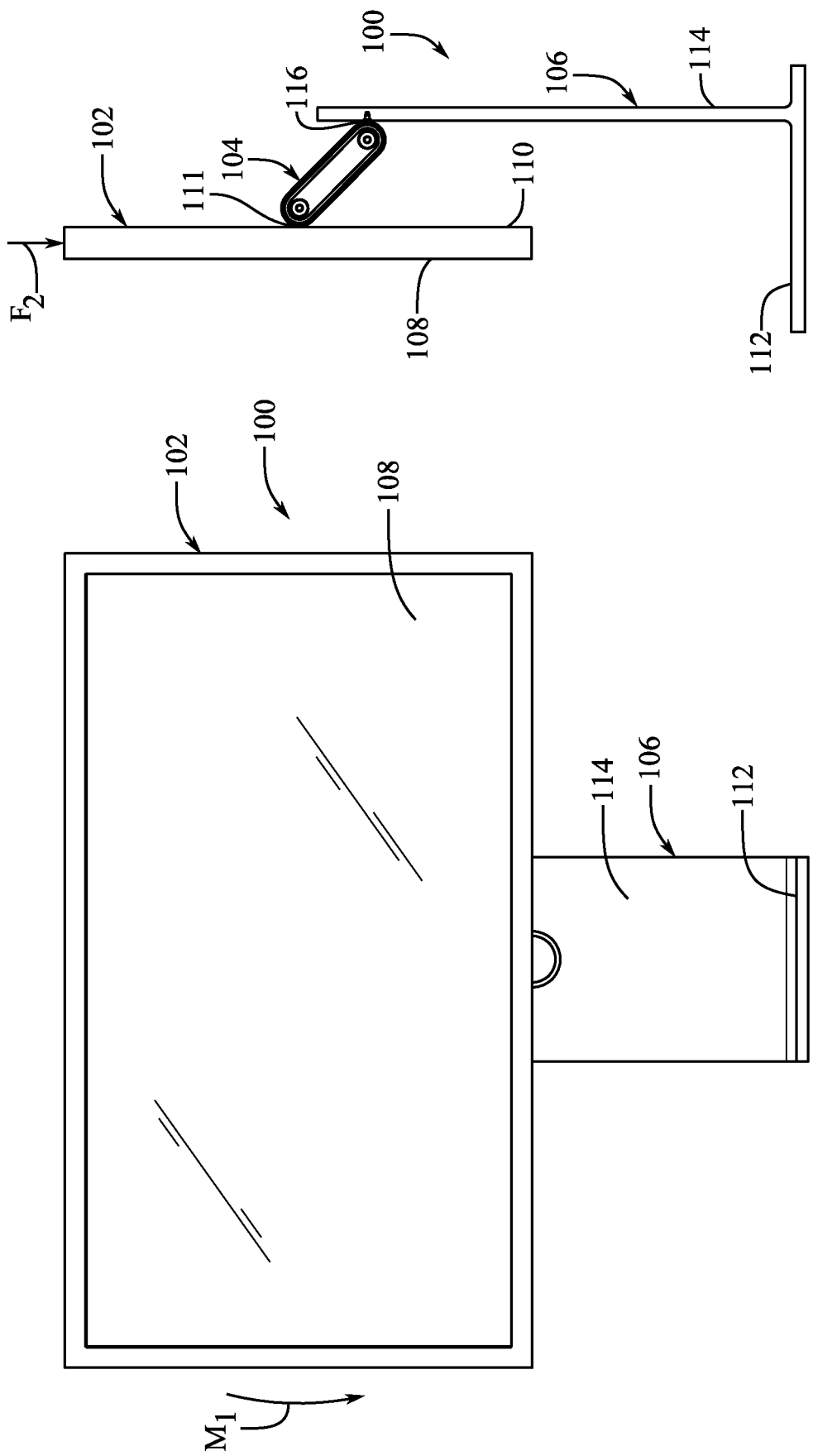

DISPLAY SUPPORT ARM MOUNT

CROSS-REFERENCE TO RELATED APPLICATION(S)

This claims priority to U.S. Provisional Patent Application No. 62/855,382, filed 31 May 2019, and entitled "DISPLAY SUPPORT ARM MOUNT," and U.S. Provisional Patent Application No. 62/728,592, filed 7 Sep. 2018, and entitled "MAGNETIC ATTACHMENT MECHANISM WITH SAFETY LATCH FOR A DESKTOP DISPLAY," the entire disclosures of which are hereby incorporated by reference.

FIELD

The described embodiments relate generally to stands and supports for electronic devices. More particularly, these embodiments relate to support arm mounts for a computer display.

BACKGROUND

Computer device designers often desire to control positioning of a computer monitor or similar display at whatever height and orientation best suited for the needs of the user. This allows the display to accommodate users and desktop surfaces of different heights, sizes, and postures. Users also generally prefer to adjust the positioning of the monitor with little expended effort.

While various existing display stands provide tilt, rotation, and vertical height adjustment of monitors, these features often come at the expense of being convenient and natural to use. For example, it can be difficult to mount the monitor to a stand, especially when the rear side of the monitor is not easily accessible or the monitor is to be mounted to the stand while the stand is in a standing position. These issues can make using a display stand difficult, awkward, and time consuming and impede the stand from having a high quality, satisfying user experience. There is therefore a constant need for improvements to stands and supports for electronic devices.

SUMMARY

An aspect of the present disclosure relates to a display assembly comprising an electronic display having a display panel and a housing, with the display panel being positioned in the housing, with the housing having a mounting recess, and with the mounting recess having a sidewall surface with at least one laterally-extending recess. The display assembly can also include a support arm configured to support the electronic display relative to a ground surface, with the support arm having a mount portion with a set of laterally-extending latches configured to be positioned in the at least one laterally-extending recess to retain the mount portion in the mounting recess of the electronic display, and with at least one latch of the set of laterally-extending latches being laterally retractable relative to the mount portion.

In some embodiments, the display assembly can further comprise a display stand attached to the support arm at an end of the support arm opposite the mount portion. The at least one laterally-extending recess can include a set of laterally-extending recesses in the sidewall surface that receive the set of laterally-extending latches. The electronic display can further comprise a first magnetic structure, and the mount portion can comprise a second magnetic structure with the first and second magnetic structures being attracted to each other while the mount portion is positioned in the mounting recess.

In some embodiments, the mount portion can be round, and the set of laterally-extending latches can be circumferentially spaced around the mount portion. The at least one latch of the set of laterally-extending latches can be biased into an extended position relative to the mount portion. The mount portion can comprise a switch configured to retract the at least one latch of the set of laterally-extending latches. The electronic display can be rotatable relative to the mount portion while the mount portion is retained to the electronic display. In some embodiments, the electronic display can be rotatable from a landscape orientation and a portrait orientation in only one rotational direction.

The housing can comprise a first magnetic structure and the mount portion can comprise a second magnetic structure, with the first and second magnetic structures being attracted to each other while the mount portion is positioned in the mounting recess. The first and second magnetic structures can be aligned along an axis, and the first and second magnetic structures can each comprise at least one magnetic portion having radially-oriented poles relative to the axis.

Another aspect of the disclosure relates to a display support arm comprising a first end configured to attach the arm to a support surface, a second end configured to attach the arm to a display, with the second end including a display-facing surface, a first magnetic structure positioned in the second end and having a first magnetic axis perpendicular to the display-facing surface, and a second magnetic structure positioned in the second end and having a second magnetic axis parallel to the display-facing surface.

The support arm can further comprise a third magnetic structure positioned in the second end and having a third magnetic axis parallel to the display-facing surface, with the third magnetic structure being positioned opposite the first magnetic structure relative to the second magnetic structure. The second and third magnetic structures can each comprise an inner end along the respective second and third magnetic axes, wherein polarities of the second and third magnetic structures at the inner ends match.

The second magnetic axis can intersect the first magnetic axis. The second magnetic axis can extend through a width of the first magnetic structure. The display-facing surface can comprise a groove or ridge configured to interface a respective ridge or groove of the display. The groove or ridge can have an overall width across the display-facing surface, with the overall width of the groove or ridge being greater than an overall width of the first and second magnetic structures.

Yet another aspect of the disclosure relates to a monitor assembly including a stand, a support arm pivotally attached to the stand, with the support arm being rotatable relative to the stand between a raised position and a lowered position and with the support arm having a monitor mount portion, and a monitor being pivotally attached to the monitor mount portion. The monitor can be rotatable relative to the support arm between a landscape orientation and a portrait orientation, and the monitor mount portion permits rotation of the monitor from the landscape orientation to the portrait orientation while the support arm is in the raised position, prevents rotation of the monitor from the landscape orientation to the portrait orientation while the support arm is in the lowered position, and prevents rotation of the support arm relative to the stand while the monitor is in the portrait orientation.

In some embodiments, a pin-and-slot feature of the support arm and the monitor prevents rotation of the monitor relative to the support arm. Rotation of the monitor to the portrait orientation can prevent rotation of the support arm relative to the stand. The monitor can be disconnectable from the monitor mount portion.

BRIEF DESCRIPTION OF THE DRAWINGS

The disclosure will be readily understood by the following detailed description in conjunction with the accompanying drawings, wherein like reference numerals designate like structural elements, and in which:

FIG. 1 shows a front view of a display in a landscape orientation and lowered position relative to a stand.

FIG. 2 shows a right side view the display assembly of FIG. 1.

FIG. 3 shows a front view of the display assembly of FIG. 1 with the display in a landscape orientation and a raised position relative to the stand.

FIG. 4 is a right side view of the display assembly of FIG. 3.

DETAILED DESCRIPTION

Figure 6:
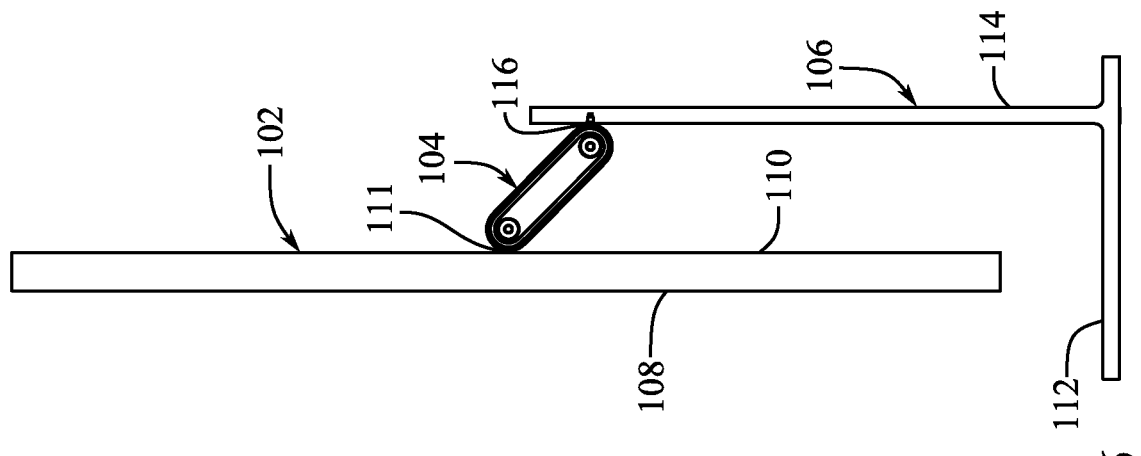
FIG. 6 shows a side view of the display assembly of FIG. 5.

Reference will now be made in detail to representative embodiments illustrated in the accompanying drawings. It should be understood that the following descriptions are not intended to limit the embodiments to any preferred embodiment. To the contrary, it is intended to cover alternatives, modifications, and equivalents as can be included within the spirit and scope of the described embodiments as defined by the appended claims.

The following disclosure relates to a display stand assembly and related methods that can make usage of the stand intuitive, secure, and robust. Traditional display stands comprise a top hook and spring latch or screw mount. Once assembled, the display can then rotate, relative to the stand, between landscape and portrait orientation. In either case, the user is required to actively move a latch or apply a screw to attach the display to the stand, and these activities can only be performed from the rear side of the screen. A user attempting to mount the display to the stand from the front of the display cannot do so. If the display stand or display are not movable to a position where the rear side of the display is accessible, the user is unable to mount the display.

Aspects of the present disclosure relate to an implementation of a display stand attachment method wherein a combination of magnetic features and latches work together to allow "blind" mounting of the display to a mounting portion (i.e., the mount portion or the "puck") of the stand. In other words, the user can hold the display from the viewing side of the display and can mount the display to the stand without the mounting portion of the stand being visible and without having to awkwardly reach behind the display in order to secure the mounting portion to the display. In some embodiments, the user can quickly and easily "click in" the display to the mounting portion with a single horizontal movement of the display relative to the support arm on the stand and then let go without the display becoming disconnected from the mounting portion.

Magnets in the display and in the mounting portion of the support arm can guide and center the display relative to the mounting portion (or vice versa) to assist the user in inserting the mounting portion into a recess in the display. Thus, the magnets can reduce or eliminate the need for the user to see the location of the recess on the display relative to the mounting portion of the support arm due to magnetic attraction that guides the mounting portion to a receiving recess of the display.

A set of retractable latches of the mount portion can keep the display secured to the support arm once the two devices have been coupled. In this manner, the magnetic attachment between the display and the support arm can be less susceptible to being unmated when a relatively large moment or other inadvertent input force is applied to the display (e.g., the user pushes against a corner of the display or accidentally pulls on the edge of the display). The latches can be connected to a release mechanism to remove the display from the mount portion or to rotate the display relative to the mount portion. At least one of the latches can comprise a feature to prevent the display from unintentionally sliding off of the mount portion when the release mechanism is operated.

Another aspect of the present disclosure relates to apparatuses and methods for controlling the rotation and movement of the support arm and display while they are mated with each other. The support arm and display can include interactive features that limit rotation of the display relative to the mounting portion unless the display is in a raised position. For example, the display can be mechanically prevented from rotating from a landscape orientation to a portrait orientation when the display is in a lowered position relative to the stand, thereby preventing the display from being rotated into contact with a desktop or other support surface under the stand. At a raised position, the rotation of the display can be mechanically unlocked or otherwise enabled, thereby allowing the display to move to a portrait orientation when its height relative to the support surface is sufficient to provide clearance between the support surface and the rotating display. Additionally, the display can be mechanically prevented from vertically translating relative to the stand while the display is in a portrait orientation in order to limit contact between the portrait-oriented display and the support surface or stand.

These and other embodiments are discussed below with reference to the figures. Those skilled in the art will readily appreciate that the detailed description given herein with respect to these figures is for explanatory purposes only and should not be construed as limiting. Features from one embodiment can be implemented in other embodiments.

Figure 5:
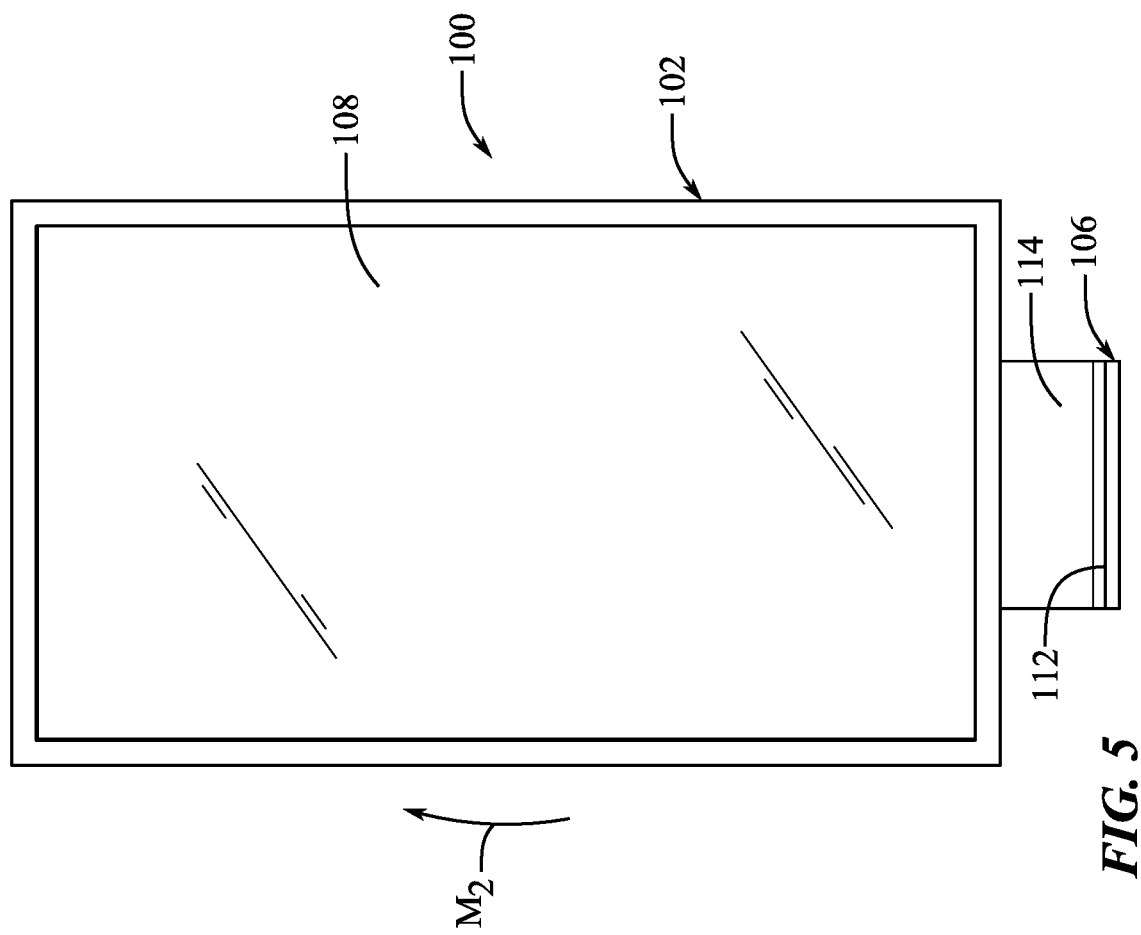
FIG. 5 shows a front view of the display assembly of FIG. 1 with the display in a portrait orientation and a raised position relative to the stand.

FIGS. 1-15 show various aspects of a display assembly 100. FIG. 1 shows a front view and FIG. 2 shows a right side view of an electronic display 102 coupled to a support arm 104 that is coupled to a stand 106. FIGS. 3-4 show the display 102 coupled to the support arm 104 in a raised position relative to the configuration shown in FIGS. 1-2. In FIGS. 1-4, the display 102 is shown in a landscape orientation, and in FIGS. 5-6, the display is in a raised position and portrait orientation. As used herein, a "landscape orientation" or "landscape position" of a display is an orientation of the display device wherein the viewable display area of the device is elongated in a horizontal direction relative to the vertical direction. A "portrait orientation" or "portrait position" of a display device is an orientation wherein the viewable display area of the device is elongated in a vertical direction relative to the horizontal direction. Generally, a landscape orientation is rotated 90 degrees about a central axis Y relative to a portrait orientation. See FIG. 8.

The display assembly 100 can be a standalone assembly wherein the support arm 104 and stand 106 are configured to support the weight of a single display 102. In some embodiments, the display assembly 100 can omit the stand 106, and the support arm 104 can be coupled to another support surface or ground surface such as, for example, a vertical wall, a horizontal rail extending laterally across the width the display 102 and behind the display 102, or another similar solid grounding structure. Additionally, stands and support arms having different configurations than those described below may be employed.

The display 102 can comprise an electronic display such as a monitor or similar visual output device for displaying information in pictorial form. The display 102 can comprise a display device (e.g., a thin film transistor liquid crystal display (TFT-LCD) with light-emitting diode (LED) or cold-cathode fluorescent lamp (CCFL) backlighting or an organic light-emitting diode (OLED) display), circuitry, a housing (e.g., housing 1420 in FIG. 14) or casing, and a power supply. The display 102 can be configured to connect to a computer using connectors and ports such as a video graphics array (VGA) connector, digital visual interface (DVI) connector, DISPLAYPORT® connector, THUNDERBOLT® connector, wireless electrical communications interfaces, or other related or similar electrical interfaces.

The display 102 can comprise a front-facing surface 108 configured to face and display information to the user for viewing. The viewable display area of the display 102 can be viewed through or at the front-facing surface 108. Thus, the front-facing surface 108 can be referred to as a viewing surface. The front-facing surface 108 can be substantially planar and flat, or it can be curved (e.g., cylindrically concave or convex). The display 102 can comprise a rear-facing surface 110 configured to face away from the user. The support arm 104 can be positioned between the rear-facing surface 110 and the stand 106. The support arm 104 can be releasably coupled to the display 102 at the rear-facing surface 110 or in rear side portions of the display 102. A mounting portion 111 of the support arm 104 can connect the display 102 to the support arm 104. See also FIGS. 7-12.

The support arm 104 can also be coupled to the stand 106. The stand 106 can comprise a base 112 configured to extend underneath the display 102 and can comprise a vertical support 114 configured to extend upward from the base 112 and behind the rear-facing surface 110 of the display 102. The vertical support 114 can have a top end at which the support arm 104 is attached at a stand attachment point 116. The stand 106 can therefore be referred to as having a generally L-shaped profile with the display 102 being positioned above a base portion 112 of the L-shape, as shown in FIGS. 2, 4, and 6. In some embodiments, the stand 106 can comprise a horizontal rail, rail and shuttle, or similar structure extending behind the rear-facing surface 110 and to which the support arm 104 is attached.

The support arm 104 can hold the display 102 in place relative to the stand 106 and can keep the display 102 in a user-selected vertical position relative to the stand 106. The support arm 104 can retain the display in multiple different positions including a lowered position (as shown in FIGS. 1-2) and a raised position (as shown in FIGS. 3-6) with the position of the display 102 remaining static (i.e., without drifting or sagging downward due to the weight of the display 102 pulling down on and rotating the support arm 104). A user can provide an input force oriented in a vertical direction to raise the display 102 relative to the stand 106, as indicated by force $F_1$ in FIG. 2, or the user can provide a vertically-oriented input force $F_2$ to lower the display 102 relative to the stand 106, as shown in FIG. 4. As the display 102 moves, it can travel through an arc-shaped path with a radius defined by the length of the support arm 104. The display 102 can, by virtue of a parallel motion linkage in the support arm 104, remain vertical (e.g., parallel to the vertical support 114, perpendicular to the base portion 112, or otherwise remaining in a single angular orientation relative to the stand 106) while traveling through the arc-shaped path.

A user can also provide an input moment $M_1$ to rotate the display 102 from a landscape orientation (see FIG. 3) to a portrait orientation or an opposite input moment $M_2$ to rotate the display 102 from a portrait orientation (see FIG. 5) to a landscape orientation. Moment $M_1$ is shown as being a counterclockwise moment, and moment $M_2$ is shown as being a clockwise moment, but the display 102 can be designed to use either direction for moments $M_1$ and $M_2$ as long as the moments $M_1$, $M_2$ oppose each other. Additionally, in some embodiments, each moment $M_1$, $M_2$ can be applied to rotate the display 102 between landscape and portrait orientation. For example, a user can apply moment $M_1$ to turn the display 102 from the landscape orientation of FIG. 3 to the portrait orientation of FIG. 5 and can apply a moment in the same direction to continue rotating the display 102 from the portrait orientation back to a landscape orientation (e.g., an upside-down/inverted landscape orientation or the orientation of FIG. 3).

Additional detail about the display 102, support arm 104, and stand 106 is provided in FIGS. 7-20. The support arm 104 can rotate relative to the stand 106 and relative to the display 102 about axes 118 and 120, as shown by the arrows in FIG. 8. In some embodiments, the support arm 104 can rotate independently relative to the stand 106 and independently relative to the display 102. The support arm 104 can also rotate in a manner keeping the mounting portion 111 parallel to the stand 106. Accordingly, with the display 102 mounted to the support arm 104, movement of the support arm 104 can change the vertical position of the display 102, as shown in FIGS. 1-4.

The mounting portion 111 of the support arm 104 can comprise a set of laterally-extending latches 122, 124, 126, wherein the latches extend laterally (i.e., to the left, right, upward, or downward), or radially, relative to a central axis Y, which extends perpendicularly and centrally through the mounting portion 111. See FIGS. 7 and 8. The mounting portion 111 can also include a central face 128, a ring-shaped ridge 130 having a first pin 132 and a second pin 134, an outer face 136 having a third pin 138, and an edge face 140 adjacent to or through which the latches 122, 124, 126 extend. See FIGS. 7-10.

Figure 9:
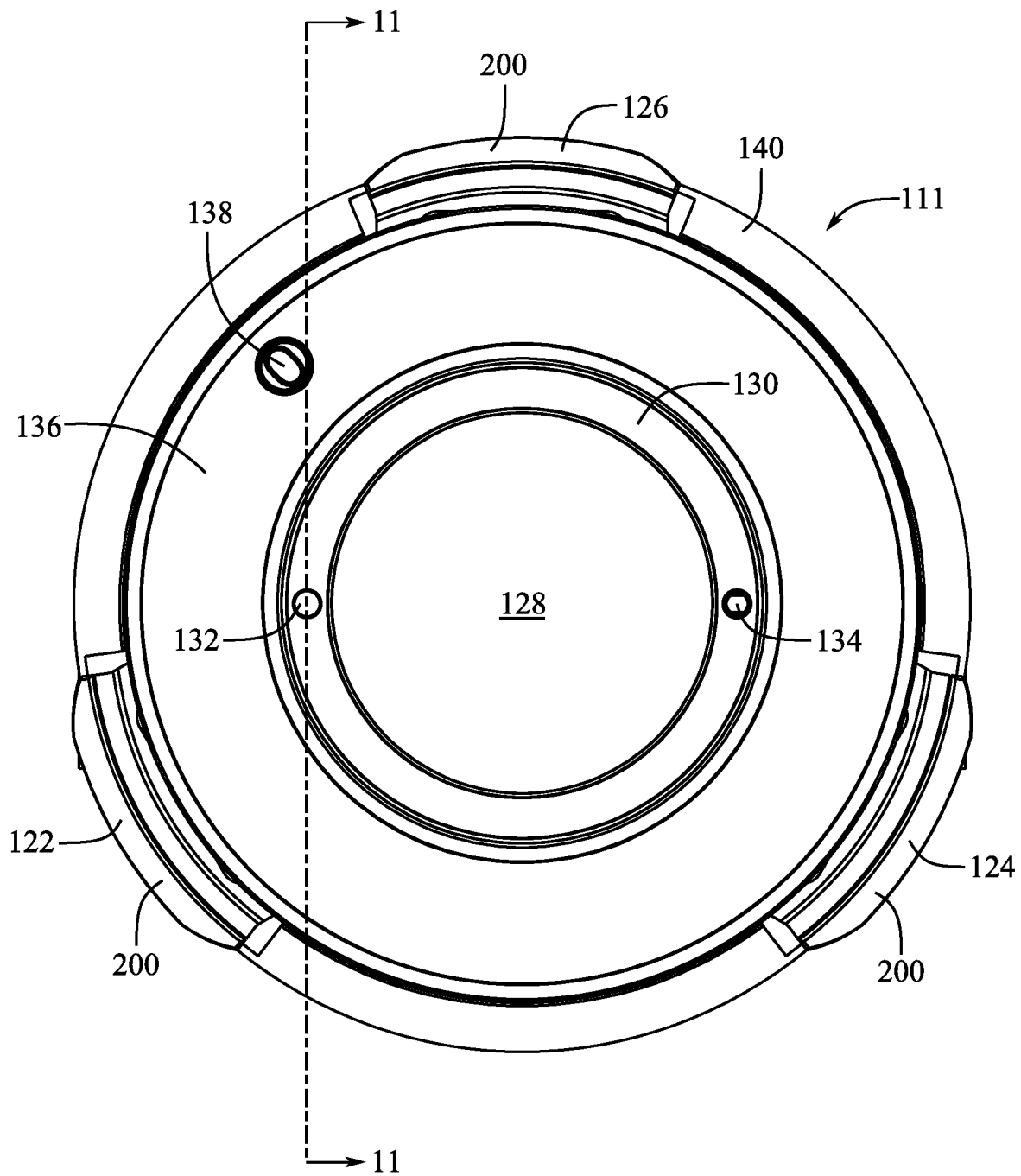
FIG. 9 shows an end view of the display-facing side of a mounting portion of the support arm of FIG. 7.
Figure 10:
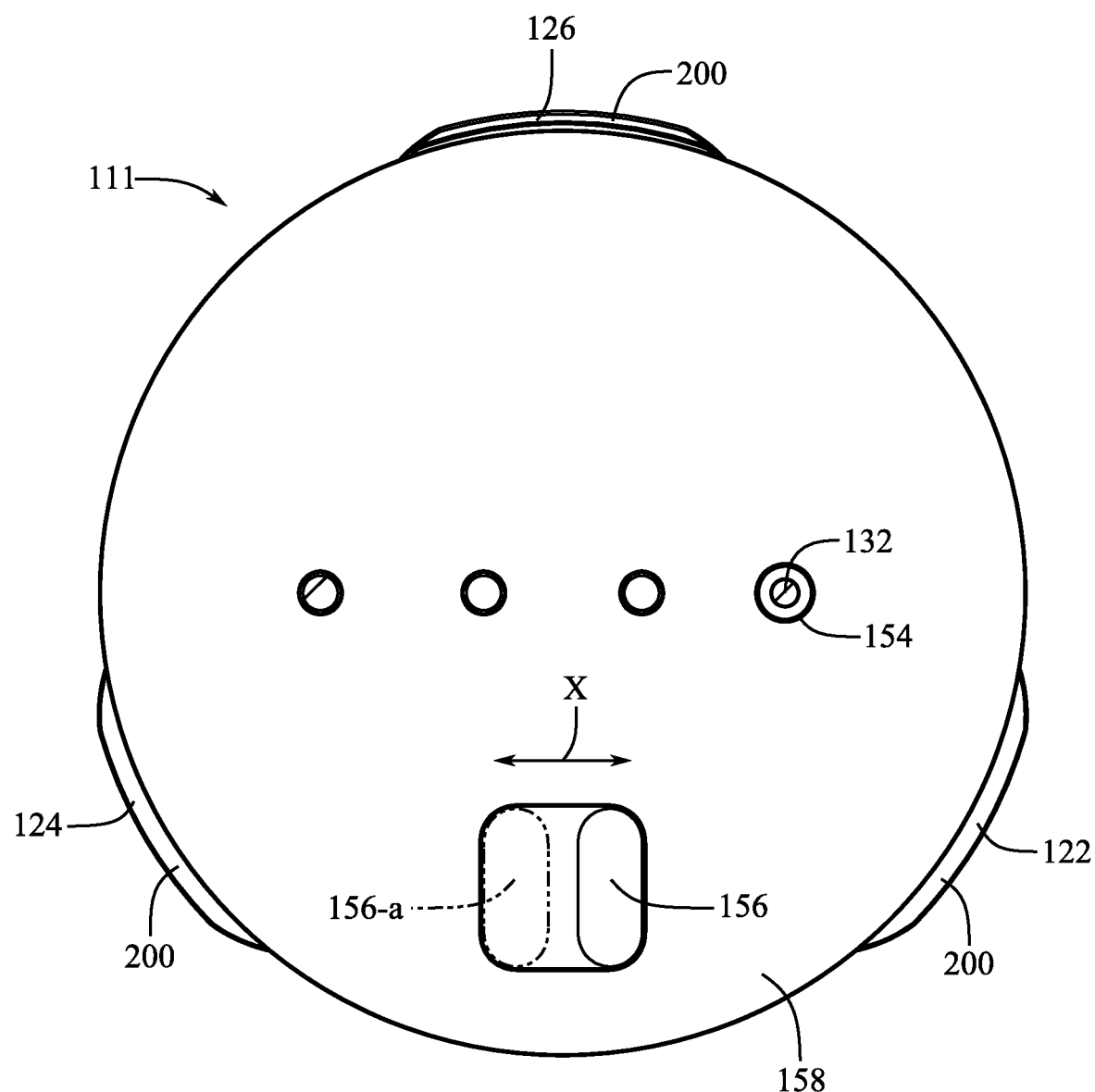
FIG. 10 shows an end view of the arm-facing side of the mounting portion of the support arm of FIG. 7.

The mounting portion 111 can have a generally circular shape, as shown in the end views of FIGS. 9 and 10. In various embodiments, the mounting portion 111 can comprise other shapes, such as an elliptical shape, a triangular shape, a square or other rectangular shape, or another polygonal shape. The general shape of the mounting portion 111 can be configured to match the general shape of a recess in the display 102 with which the mounting portion 111 is mated, providing keyed structures for desired mating of the display 102 with the mounting portion 111. See FIGS. 14-17. Latches 122, 124, 126 can extend from rounded surfaces such as edge face 140 or from straight surfaces (e.g., on a rectangular shaped mounting portion 111).

Figure 7:
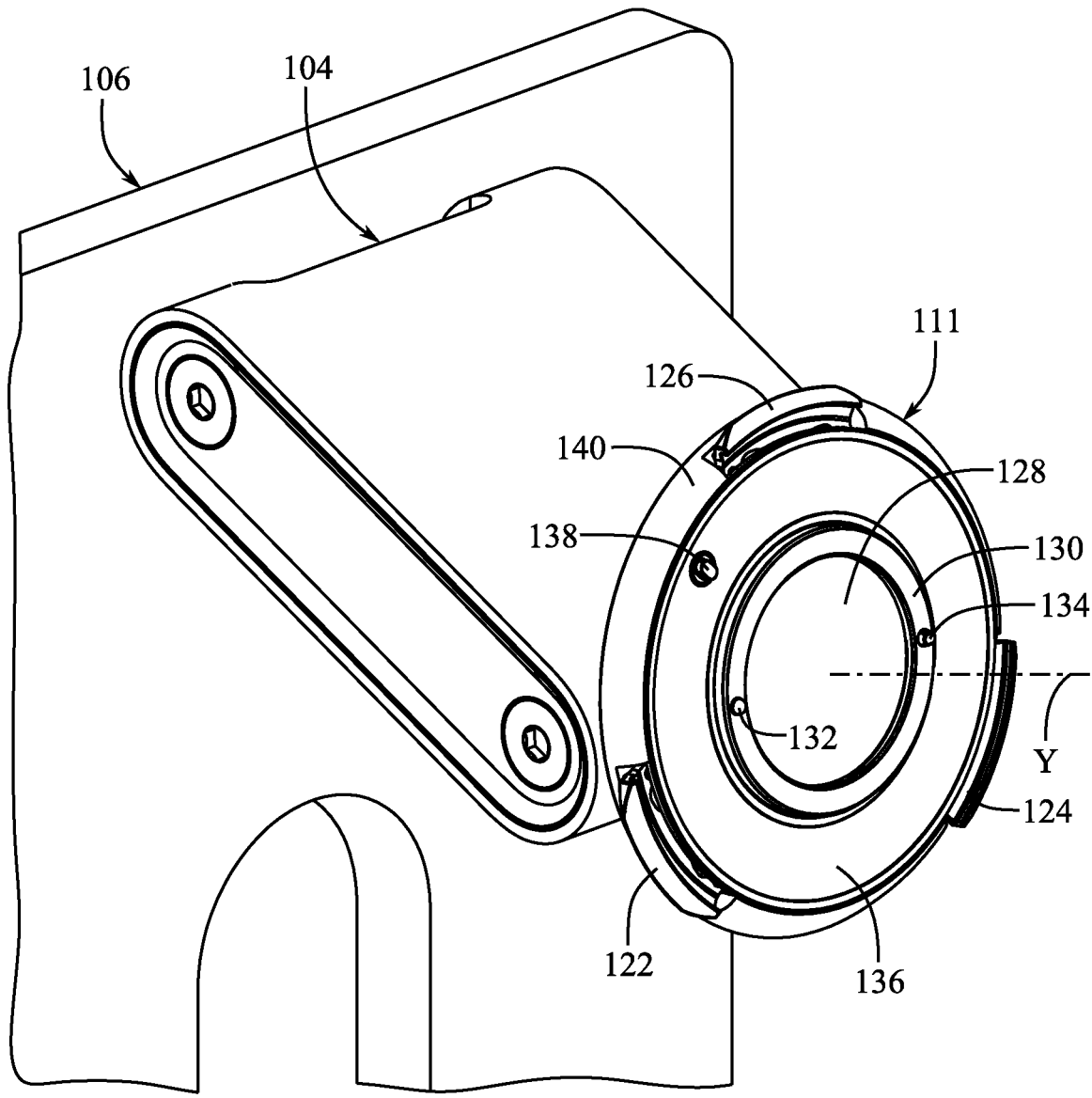
FIG. 7 shows an isometric view of the upper end of a stand and support arm of a display assembly.
Figure 8:
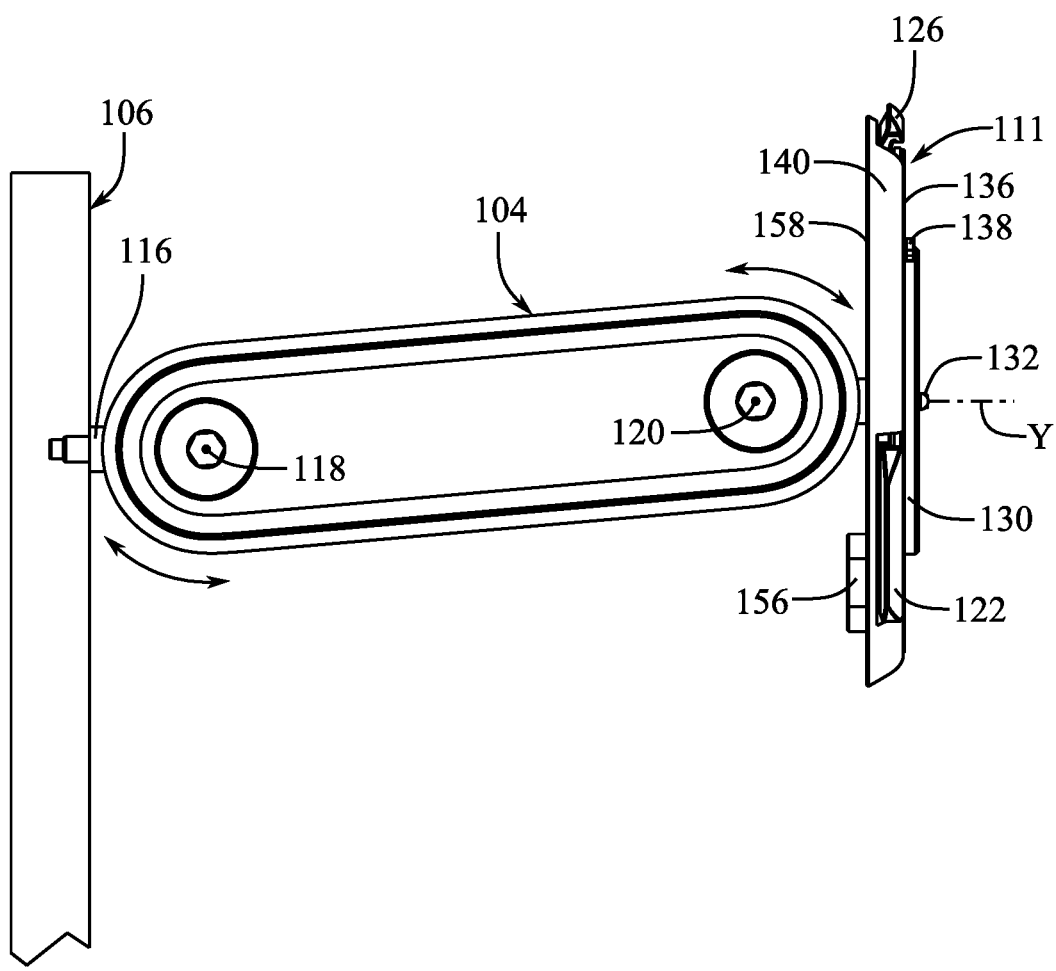
FIG. 8 shows a side view of the components of FIG. 7.
Figure 11:
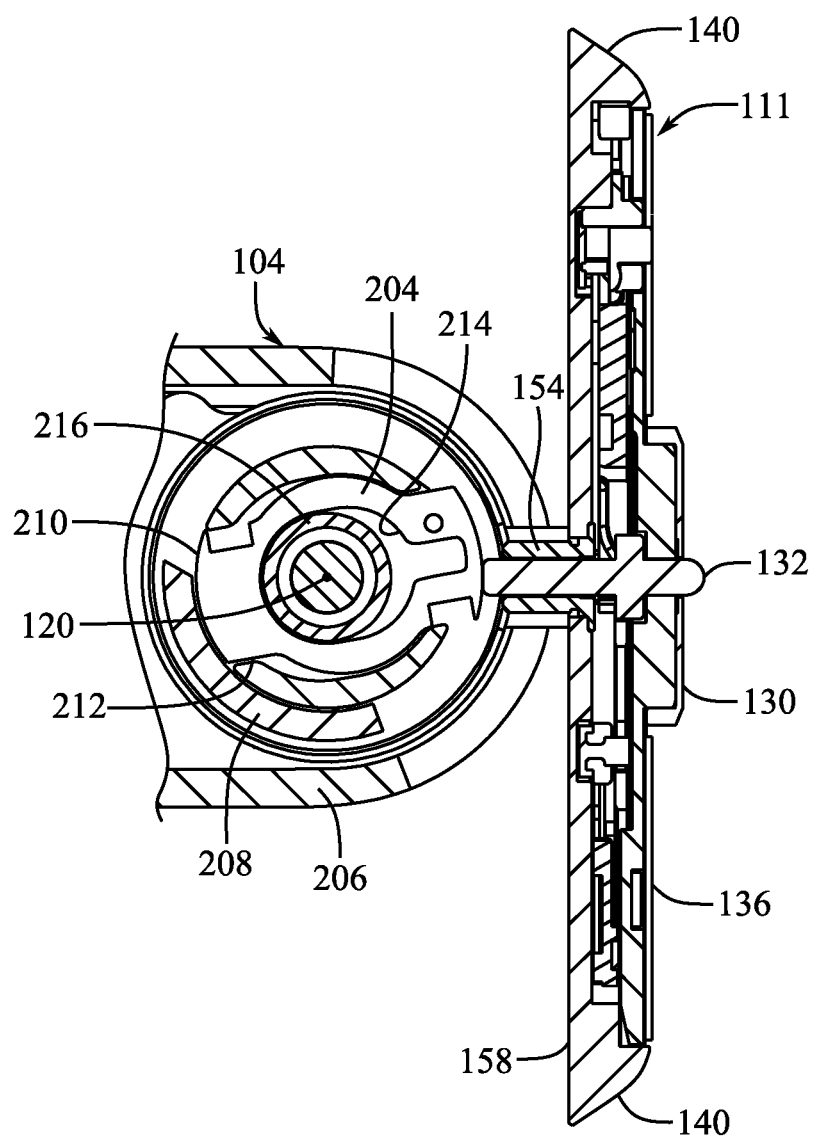
FIG. 11 shows a side section view of the support arm as taken through section lines 11-11 in FIG. 9.
Figure 12:
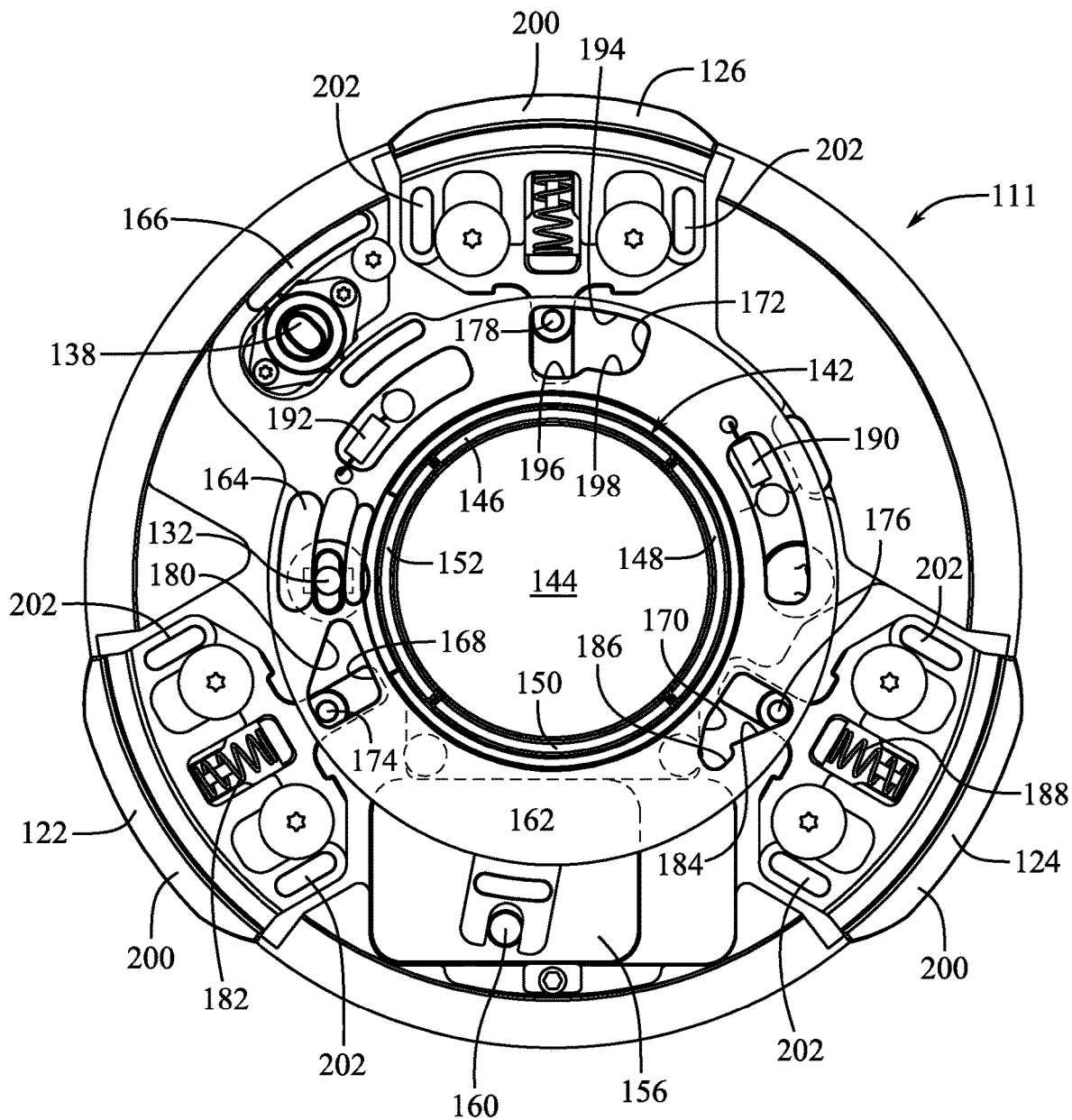
FIG. 12 is an end view of the mounting portion of the support arm of FIG. 7 with the outermost display-facing surfaces omitted to show internal detail.

FIG. 7 shows an isometric view of the upper end of the stand 106, the support arm 104, and the mounting portion 111. FIG. 8 shows a side view of those components. FIG. 9 shows an end view of the display-facing side of the mounting portion 111, and FIG. 10 shows an end view of the arm-facing side of the mounting portion 111. FIG. 11 shows a side section view of the mounting portion 111 as taken through section lines 11-11 in FIG. 9. FIG. 12 is an end view of the mounting portion 111 with the outermost display-facing surfaces (i.e., central face 128, ridge 130, and outer face 136) omitted to show detail of the interior of the mounting portion 111.

The central face 128 of the mounting portion 111 can be a generally flat portion of the mounting portion 111 that covers a magnetic assembly 142. See FIGS. 9 and 12. The magnetic assembly 142 can be substantially planar and arranged parallel to the central face 128 within the mounting portion 111. The magnetic assembly 142 can comprise a first magnetic structure 144, a second magnetic structure 146, a third magnetic structure 148, a fourth magnetic structure 150, and a fifth magnetic structure 152. See FIG. 12.

The first magnetic structure 144 can be positioned centrally aligned with the central axis Y of the mounting portion 111. The second through fifth magnetic structures can be positioned circumferentially spaced around the first magnetic structure 144. The first magnetic structure 144 can be circular, as shown, and in some cases can have another polygonal or elliptical shape. The second through fifth magnetic structures can therefore be positioned around a circumference or a perimeter of the polygonal or elliptical shape of the first magnetic structure 144. In some embodiments, fewer than four additional magnetic structures are positioned around the first magnetic structure 144. For example, the first magnetic structure 144 can be the only magnetic structure or there can be a total of two, three, or four magnetic structures including the first magnetic structure 144 located centrally within the others. In some cases, the first magnetic structure 144 can be omitted, and the second through fifth magnetic structures (or a subset thereof) can be provided alone.

The magnetic structures 144, 146, 148, 150, 152 can comprise parts magnetically attracted to other magnetic structures (e.g., 1302 or 1650/1652/1654 in FIGS. 13, 16, and 17) in the display. Thus, the magnetic structures 144, 146, 148, 150, 152 can comprise permanent magnets (e.g., rare earth magnets), electromagnets, ferrous materials, similar magnetic materials, and combinations thereof. The function of the magnetic structures 144, 146, 148, 150, 152 of the mounting portion 111 is described in more detail below in connection with FIGS. 13 and 16-17.

The ring-shaped ridge 130 can extend away from the central face 128 and the outer face 136 in an axial direction (i.e., parallel to central axis Y). The ridge 130 can be configured to be seated in a groove 1404 (see FIG. 14) in the display 102. In some embodiments, the ridge 130 can be a recess and the groove 1404 of the display 102 can be a ridge, thereby reversing their roles. The ridge 130 can mechanically prevent the mounting portion 111 from translating laterally relative to the display 102 while the ridge is positioned within the groove 1404. Thus, with the ridge 130 and groove 1404 mated, the user can be sure that the display 102 is properly positioned on the mounting portion 111 and will not easily slide off of the mounting portion 111 or apply radial pressure to the latches 122, 124, 126. In one embodiment, the ridge 130 can have an overall or maximum width/diameter and a minimum width/diameter that are each greater than the overall width/diameter of the magnetic assembly 142.

The first pin 132 can extend from a display-facing surface of the ridge 130 in an axial direction (parallel to the Y axis). As shown in FIGS. 10 and 11, the first pin 132 can be a peg or bolt shape extending through the display-facing side of the mounting portion 111 and through the arm-facing side of the mounting portion 111. The first pin 132 can be seated in a bushing 154 in the mounting portion 111 and can be slidable relative to the bushing 154 and relative to the mounting portion 111. As explained in further detail below, the first pin 132 can limit movement of the support arm 104 relative to the stand 106 when the release mechanism 156 of the mounting portion 111 is operated.

The second pin 134 can extend from the display-facing surface of the ridge 130 in an axial direction. The second pin 134 can be stationary relative to the ridge 130 and can mechanically interface with a second recess 1408 in the housing 1420 of the display 102, as explained in further detail below. See FIG. 14.

The outer face 136 can comprise a generally flat surface that is parallel to or in-plane with the central face 128. The outer face 136 can comprise a high-friction material relative to the ridge 130 and relative to the central face 128. For example, the outer face 136 can comprise a silicone surface covering that generates relatively high friction when pressed against the display 102. The high-friction material can help prevent relative sliding between the display 102 and the mounting portion 111 and can reduce scratching or marring of the rear surfaces of the display 102. Beneath the surface covering, the outer face 136 can comprise a rigid material such as a metal material (e.g., steel or aluminum).

The third pin 138 can extend from the outer face 136 in an axial direction. The third pin can be axially retractable into the outer face 136 as the display 102 is rotated relative to the mounting portion 111. The third pin 138 can be configured to resist or prevent being axially retracted in this manner when the support arm 104 is not in the raised position. The third pin 138 can be prevented from retracting into the outer face 136 unless the release mechanism 156 is operated.

The edge face 140 can be a beveled, chamfered, or otherwise angled face surrounding the outer face 136. The edge face 140 can therefore help guide or funnel the mounting portion 111 into the recess 1400 of the display 102, as explained in further detail below in connection with FIGS. 16 and 17.

The release mechanism 156 is shown in FIGS. 8, 10, and 12. FIG. 8 shows a side view, FIG. 10 shows an outer end view, and FIG. 12 shows an inside end view. The release mechanism 156 is shown protruding from a rear surface 158 of the mounting portion 111 in a manner that makes it easy to find by blind touch, i.e., by a user's hand even when the user cannot look behind the display 102 to see the rear surface 158. In some embodiments, the release mechanism 156 does not protrude or is recessed into the rear surface 158. The release mechanism 156 can be laterally slidable (i.e., slidable along axis X in FIG. 10) relative to the mounting portion 111 between a first position shown in FIG. 10 and a second position at position 156-a in FIG. 10.

The release mechanism 156 can be operated to release the display 102 from the mounting portion 111 or to release the display 102 from being locked in the landscape orientation relative to the mounting portion 111. The release mechanism 156 is coupled, via a pin 160, to a rotatable ring 162 within the mounting portion 111. See FIG. 12. Sliding the release mechanism 156 to position 156-a in FIG. 10 can therefore cause the rotatable ring 162 to rotate about the central axis Y. Ramped surfaces 164, 166 of the rotatable ring 162 can engage portions of the first and third pins 132, 138 and can retract them when the rotatable ring 162 is turned (or can allow them to be retracted) into the mounting portion 111. The ramped surfaces 164, 166 can prevent rotation of the ring 162 if the support arm 104 is not at is maximum raised position due to the first pin 132 being prevented from retracting by the locking member 204. See FIG. 11 and its related descriptions herein.

The rotatable ring 162 can also comprise a first latch pin opening 168, a second latch pin opening 170, and a third latch pin opening 172 in which respective first, second, and third pins 174, 176, 178 of the first, second, and third latches 122, 124, 126 are located. The first latch pin opening 168 can have a radially ramped surface 180. Accordingly, as the rotatable ring 162 turns counterclockwise in FIG. 12, the first latch pin 174 can be pulled radially inward (i.e., toward the central axis Y while contacting the radially ramped surface 180). The first latch 122 is pulled radially inward as the first latch pin 174 is pulled inward. When the rotatable ring 162 moves clockwise, the first latch pin 174 can slide back along the radially ramped surface 180 to the position shown in FIG. 12 due to a radially-oriented biasing device 182 acting on the first latch 122.

The second latch pin opening 170 can have a ramped surface 184 and a notch 186. Thus, as the rotatable ring 162 turns counterclockwise in FIG. 12, the second latch pin 176 can be pulled radially inward along the ramped surface 184. The second latch 124 is pulled radially inward as the second latch pin 176 is pulled inward, similar to the first latch 122.

However, once sufficient rotation of the rotatable ring 162 occurs, the second latch pin 176 can be seated in the notch 186 due to the radially-outward-directed biasing force applied by biasing device 188 on the second latch 124. When the second latch pin 176 is seated in the notch 186, the rotatable ring 162 is prevented from turning clockwise back to the position shown in FIG. 12 by interference between the notch 186 and the second latch pin 176, even though the rotatable ring 162 is biased to the position shown in FIG. 12 by circumferential biasing structures 190, 192. However, if the second latch pin 176 is moved radially inward, such as by the second latch 124 being forced radially inward by a portion of the recess of the display 102 (e.g., lip 1456 in FIG. 14; see also FIGS. 18-20), the second latch pin 176 can move out of the notch 186, and the rotatable ring 162 can return to the position shown in FIG. 12 due to being acted upon by circumferential biasing structures 190, 192.

The third latch pin opening 172 can have a circumferential surface 194, a first inner surface 196, and a second inner surface 198. As the rotatable ring 162 turns counterclockwise in FIG. 12, the third latch pin 178 can move within the third latch pin opening 172 along the circumferential surface 194. Unlike the first and second latch pin openings 168, 170, the third latch pin opening 172 does not radially withdraw the third latch 126 because the circumferential surface 194 is not radially ramped. Thus, the third latch 126 remains in the position shown in FIG. 12 as the rotatable ring 162 is rotated. This can be beneficial because the third latch 126 is positioned at the vertical top and center of the mounting portion 111.

When the display 102 is mounted to the mounting portion 111 and the release mechanism 156 is operated, the first and second latches 122, 124 can at least partially retract relative to the edge face 140, thereby reducing the overall radii of the mounting portion 111 at the positions of the first and second latches 122, 124 in a manner permitting the mounting portion 111 to be withdrawn from a recess in the display 102 having a radius less than the radii of the extended first and second latches 122, 124. If the third latch 126 were to withdraw in the same manner as the first and second latches 122, 124, the display 102 could potentially slip off of the mounting portion 111 due to all of the latches 122, 124, 126 being smaller in radius than the radius of the recess of the display 102. However, because the third latch 126 does not withdraw upon operation of the release mechanism 156, the third latch 126 can remain hooked to the recess of the display 102 (i.e., it can remain positioned under a lip structure of the recess, as explained in further detail below), and it can thereby prevent accidental disconnection of the display 102 from the mounting portion 111 by keeping the display 102 "hooked" in place.

With the release mechanism 156 triggered into position 156-a, the first and second latches 122, 124 are radially withdrawn, and the third latch 126 is partially radially withdrawable upon pulling the display 102 away from the mounting portion 111. The third latch 126 is radially withdrawable due to the size of the third latch pin opening 172 providing space for radially inward translation of the third pin 178 up to the second inner surface 198. The third latch 126 can be radially withdrawn in a manner similar to the first and second latches 122, 124 due to the third latch 126 coming into contact with a lip structure surface of the recess of the display 102 (e.g., lip 1456 in FIGS. 14 and 18-20) and at least partially sliding radially inward as a result.

The second inner surface 198 can be spaced radially outward relative to the first inner surface 196 to limit the amount of radial withdrawal of the third latch 126 as the mounting portion 111 is pulled from the display 102. A small amount of protrusion of the third latch 126 relative to the edge face 140 while the display 102 is pulled from the mounting portion 111 can require the user to pull laterally along the central axis Y while also pulling on the display 102 or rotating it upward (similar to force $F_1$ in FIG. 1) in order to completely remove the display 102 from the mounting portion 111. This additional upward motion can help ensure that the user is intentionally removing the display 102 when the release mechanism 156 is operated and limits the ability of the display 102 to unintentionally slide off of the mounting portion 111 in a horizontal direction.

The first inner surface 196 of the third latch pin opening 172 can be radially closer to the central axis Y relative to the second inner surface 198 thereof so that the third latch 126 can be fully radially retracted into the mounting portion 111 when the display 102 is being mated to the mounting portion 111. The user therefore can push the display 102 directly (i.e., solely horizontally) onto the mounting portion 111 along central axis Y without first having to hook or hang the display 102 onto the third latch 126.

The latches 122, 124, 126 can comprise multiple materials. In some embodiments, the radially-outermost portions 200 of the latches 122, 124, 126 can comprise a non-marking and low-friction material such as plastic (e.g., nylon), elastomer (e.g., rubber), or a similar material. Accordingly, as the latches 122, 124, 126 slide against surfaces of the display 102, they can be less susceptible to scratching the finish of the display 102 and can slide against the display 102 with low friction. Other internal surfaces of the latches 122, 124, 126 can comprise a low-friction material, including, for example, the pins 174, 176, 178 and runners (e.g., 202) that will contact or slide against surfaces within the mounting portion 111. Other structures in the latches 122, 124, 126 can comprise high-strength, load-bearing materials to resist bending or breaking such as, for example, steel or other iron alloys.

As shown in FIG. 11, when the support arm 104 is in an at least partially lowered position (e.g., as shown in FIG. 2), the first pin 132 can contact a locking member 204 within the support arm 104. As the support arm 104 is moved to a raised position (e.g., as shown in FIG. 4), the housing 206 and a block 208 of the support arm 104 can rotate about axis 120. At a sufficient raised angle of the support arm 104, the block 208 rotates out of contact with an inner surface 210 of the locking member 204, thereby allowing the inner surface 210 of the locking member 204 to move along the axis of the first pin 132 when the first pin 132 moves toward axis 120 and presses inward on the locking member 204. The first pin 132 can push against the locking member 204 when the release mechanism 156 is operated and the ramped surface 164 rotates and longitudinally slides the first pin 132.

With the support arm 104 in the raised position and the release mechanism 156 triggered, the first pin 132 and locking member 204 are moved rearward relative to rear surface 158, and contact between a bottom surface 212 of the locking member 204 and the block 208 prevents the support arm 104 from rotating back to a lowered position. Accordingly, while the first pin 132 and locking member 204 are moved rearward, the display 102 is unable to translate downward relative to the stand 106. For this reason, the first pin 132 can be referred to as a lockout pin. When the release mechanism 156 moves back to its default/biased position (as shown in FIG. 12), the first pin 132 and locking member 204 can return to the position shown in FIG. 11, thereby allowing the block 208 to rotate about the pivot axis 120 to a position behind the locking member 204 (i.e., a position opposite the first pin 132) and allowing the entire support arm 104 to rotate as well. The locking member 204 can comprise an elongated central opening 214 configured to allow the locking member 204 to translate relative to a central shaft 216 positioned around the pivot axis 120.

Figure 13:
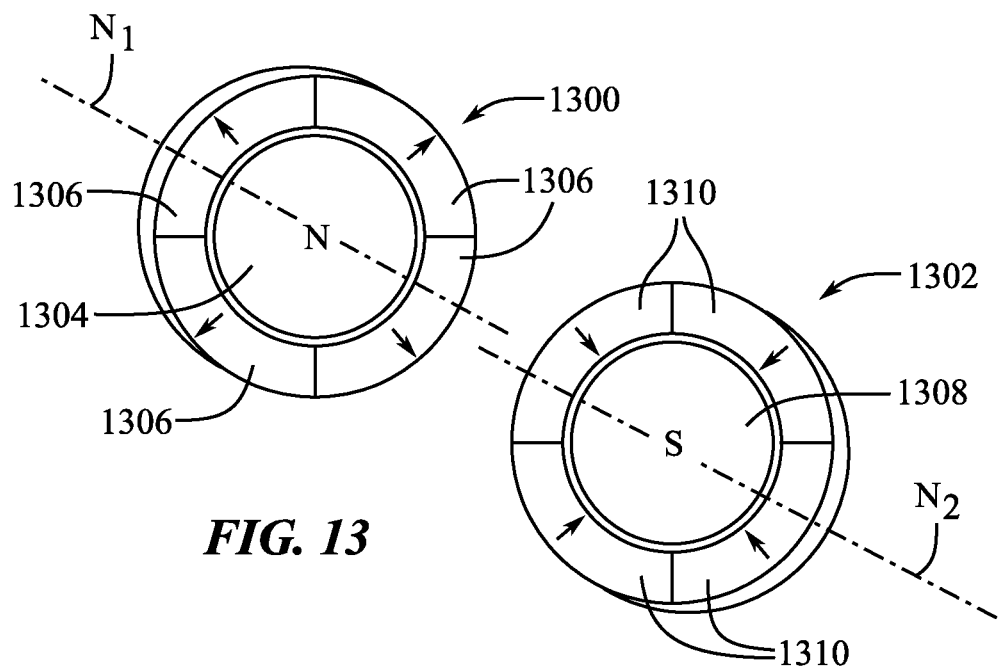
FIG. 13 is a diagram of magnetic assemblies.

FIG. 13 is a diagram illustrating additional detail about magnetic assemblies 1300, 1302 that can be positioned in the display 102 and in the mounting portion 111. One of the magnetic assemblies 1300, 1302 can be positioned in the display 102, and one can be positioned in the mounting portion 111. For example, magnetic assembly 1300 can comprise magnetic structures 144, 146, 148, 150, and 152 in the mounting portion 111. See FIG. 12.

The magnetic assemblies 1300, 1302 can comprise central magnetic structures 1304, 1308 that are each surrounded by peripheral magnetic structures 1306, 1310. The central magnetic structures 1304, 1308 can have respective magnetic axes $N_1$, $N_2$ configured to be oriented parallel to or coaxial with the central axis Y of the mounting portion 111. Thus, the magnetic axes $N_1$, $N_2$ can be coaxial with or parallel to each other.

One of the central magnetic structures 1304 can comprise an outward end or face along the magnetic axis $N_1$ that has a first polarity (i.e., north polarity as shown in FIG. 13), and the other central magnetic structure 1308 can comprise an outward end or face along its axis $N_2$ having a second, opposite polarity (i.e., south polarity as shown in FIG. 13). The outward ends or faces of the central magnetic structures 1304, 1308 can be configured to face each other when the display 102 is mounted to the mounting portion 111. See also FIGS. 16-17 and their related descriptions herein. Accordingly, the central magnetic structures 1304, 1308 can be attracted to each other when the magnetic assemblies 1300, 1302 approach each other. For this reason, the central magnetic structures 1304, 1308 can apply a magnetic force to the help the user guide the display 102 and mounting portion 111 into contact with each other when the display 102 is mounted to the mounting portion 111. This can be beneficial when the user is unable to see the mounting portion 111 and the back of the display 102, such as when the user is blind-installing the display 102 to the mounting portion 111 (i.e., installing with only the viewing side of the display 102 visible and the rear side of the display 102 being out of view).

The peripheral magnetic structures 1306, 1310 can each comprise individual peripheral magnetic axes that perpendicularly intersect the magnetic axes $N_1$, $N_2$. These peripheral magnetic axes are shown as arrows in FIGS. 13, 16, and 17. In some embodiments, all of the peripheral magnetic axes of the peripheral magnetic structures 1306, 1310 are coplanar, and the magnetic axes $N_1$, $N_2$ perpendicularly intersect the planes of the peripheral magnetic axes. The peripheral magnetic axes can be referred to as radially-oriented poles or radially-oriented polar axes of the peripheral magnetic structures 1306, 1310. In magnetic assembly 1300, the peripheral magnetic axes can have southern polarity at a radially inward end (relative to magnetic axis $N_1$) of each of the peripheral magnetic structures 1306 and can have northern polarity at a radially outward end thereof. Peripheral magnetic structures 1310 can have reversed polarity relative to peripheral magnetic structures 1306. Accordingly, in each magnetic assembly 1300, 1302, the peripheral magnetic structures 1306, 1310 can have central magnetic structures 1304, 1308 having outward-facing end polarity that is opposite the radially-inward polarity of their respective peripheral magnetic structures 1306, 1310.

The combined central magnetic structure 1304 and peripheral magnetic structures 1306 can form a magnetic flux that, when approached by central magnetic structure 1308 and peripheral magnetic structures 1310, helps to align the magnetic axes $N_1$, $N_2$. The central magnetic structures 1304, 1308 can provide a longitudinal pull force toward each other, and the peripheral magnetic structures 1306, 1310 can provide a longitudinal pull force in addition to a lateral guiding force that makes each of the peripheral magnetic structures try to align with a corresponding peripheral magnetic structure on an opposite magnetic assembly. Accordingly, the magnetic assemblies 1300, 1302 can simultaneously guide each other toward each other in longitudinal and lateral/radial directions. A user carrying the display 102 can therefore feel the magnetic assemblies 1300, 1302 pulling the display 102 toward the mounting portion 111 while also pulling the magnetic axes $N_1$, $N_2$ into alignment.

Figure 14:
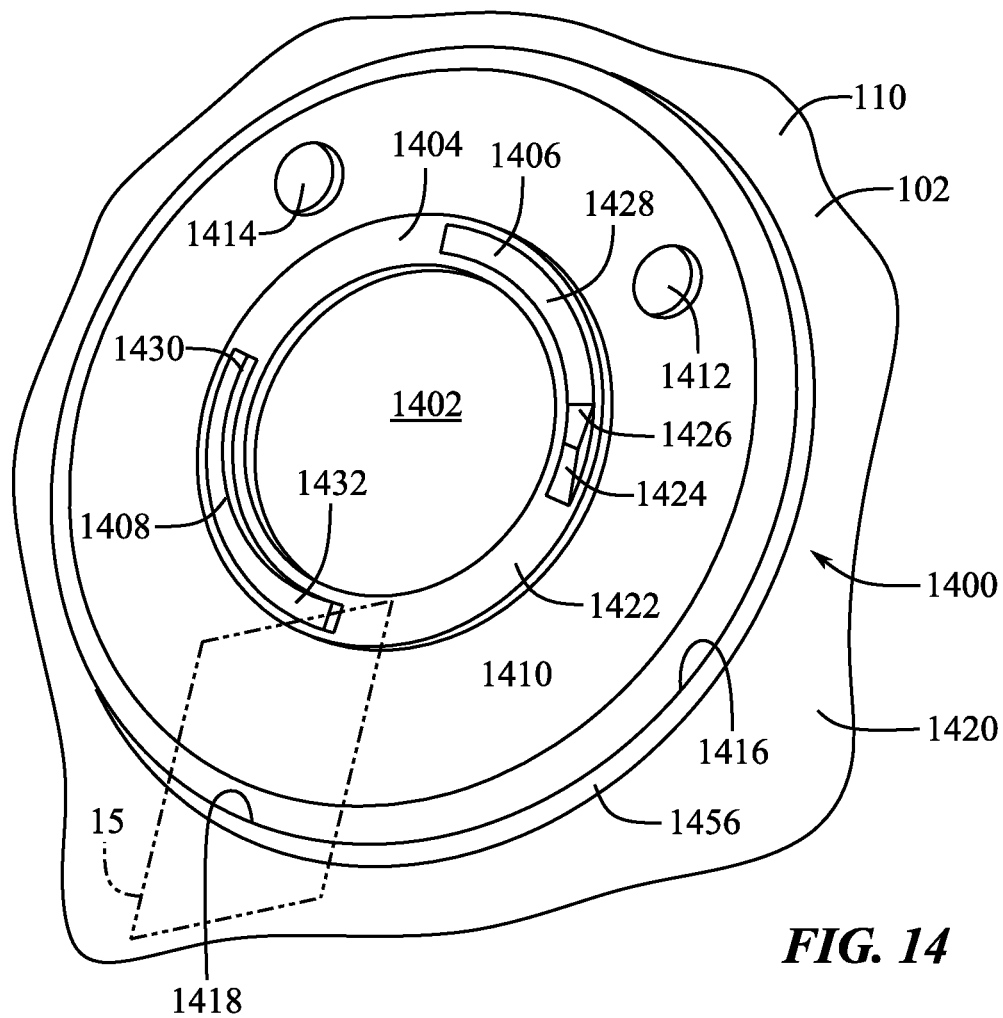
FIG. 14 is an isometric view of a rear side of a housing of a display.
Figure 15:
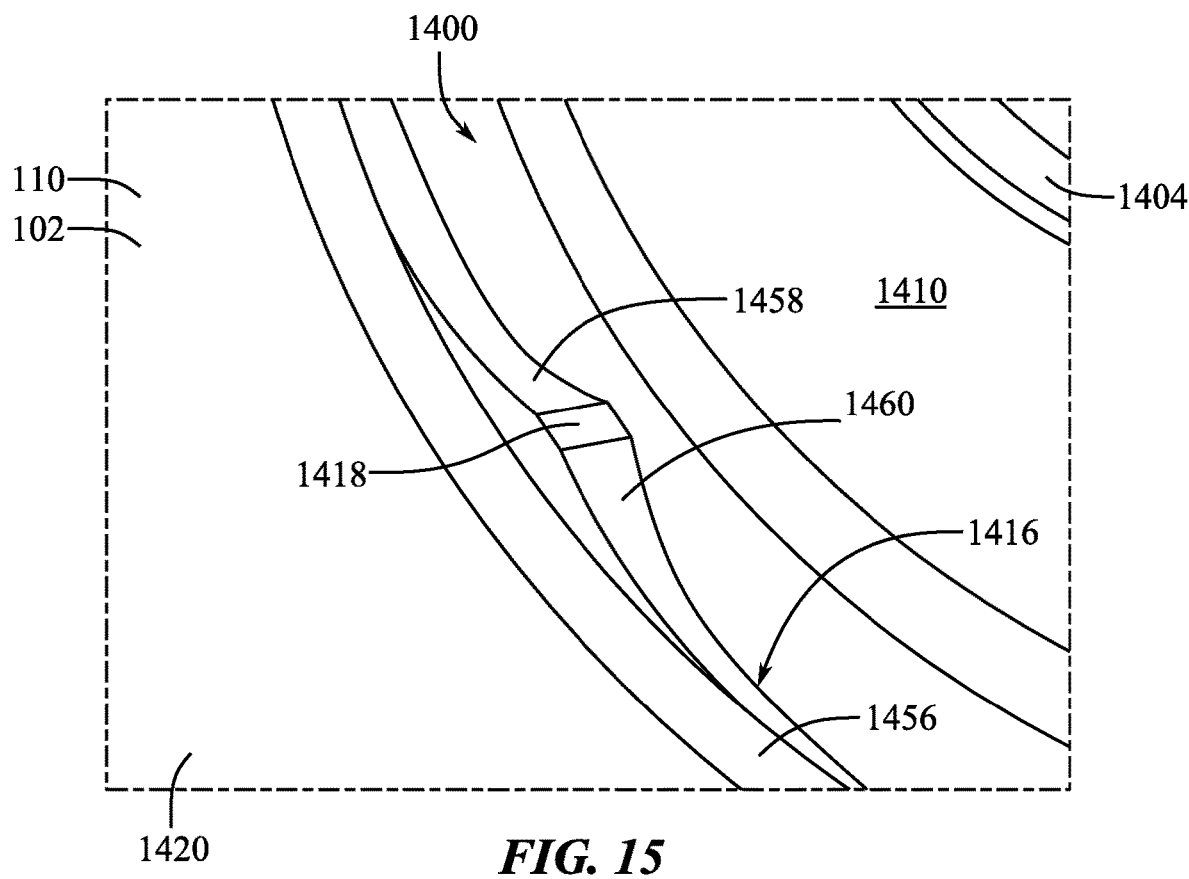
FIG. 15 is an isometric view of a bottom end portion of a recess of the housing of FIG. 14.

FIGS. 14-15 illustrate features of a recess 1400 in a rear-facing surface 110 the display 102. FIG. 14 is an isometric view of the recess 1400. The recess 1400 can comprise a central face 1402, a groove 1404 having a first recess 1406 and a second recess 1408, an outer face 1410 having a third recess 1412 and a fourth recess 1414, and at least one laterally-extending recess 1416. FIG. 15 shows a detail isometric view of a portion of the recess 1400 at a bottom end portion 1418 of the laterally-extending recess 1416, wherein the isometric view of FIG. 15 is from a different viewing angle relative to FIG. 14 at box 15 in FIG. 14.

The central face 1402 of the recess 1400 can be a generally flat portion that covers a magnetic assembly (e.g., 1300 or 1302). See FIGS. 13-14. The magnetic assembly of the display 102 can be substantially planar and arranged parallel to the central face 1402 within the housing 1420 of the display 102. The central face 1402 can have a shape (e.g., circular) and size corresponding to the shape and size of the magnetic assembly it covers, similar to central face 128.

The groove 1404 can be ring-shaped and similar in size to the ring-shaped ridge 130 of the mounting portion 111. The groove 1404 can be configured to receive the ridge 130, as explained above in connection with FIGS. 7-9. The groove 1404 can comprise a strong load-bearing material such as, for example, steel or another iron alloy.

The first recess 1406 can extend circumferentially around and longitudinally into the inner face 1422 of the groove 1404. The first recess 1406 can be positioned on the groove 1404 to receive the first pin 132 of the mounting portion 111. When the display 102 is in a landscape orientation, the first pin 132 can be positioned in a first end 1424 of the first recess 1406. In this position, the first pin 132 can extend fully from the display-facing surface of the ridge 130 (e.g., in the position shown in FIG. 11). Accordingly, the support arm 104 can pivot freely between raised and lowered positions because the locking member 204 is not displaced by the first pin 132 into a position interfering with block 208. See also FIG. 11 and related descriptions herein.

The first recess 1406 can comprise a ramp surface 1426 between the first end 1424 and a second end 1428 thereof. The second end 1428 of the first recess 1406 can be shallower in depth relative to first end 1424 when compared to inner face 1422. Accordingly, when the first pin 132 and locking member 204 are prevented from moving by the block 208, the display 102 cannot rotate from landscape to portrait orientation because the first pin 132 contacts the ramp surface 1426 but cannot withdraw into the ridge 130. However, with the support arm 104 in the raised position and with the release mechanism 156 triggered, the first pin 132 is able to withdraw when contacting the ramp surface 1426. Accordingly, the first pin 132 can slide into contact with the second end 1428 of the first recess 1406. While in contact with the second end 1428, the first pin 132 cannot extend back out of the ridge 130, so the bottom surface 212 of the locking member 204 blocks rotation of the block 208 and housing 206 of the support arm 104. For this reason, the support arm 104 cannot rotate to a lowered position while the display 102 is in the portrait orientation (which corresponds to the first pin 132 contacting the second end 1428). In order to return to a lowered position of the support arm 104, the display 102 must rotate to a landscape orientation with first pin 132 contacting or proximate to the first end 1424 since in that case the bottom surface 212 of locking member 204 can move out of the way of the block 208.

The support arm 104 can require movement of the locking member 204 in order for the first pin 132 to be retracted into the mount portion 111. The display 102 cannot be removed, and the release mechanism 156 cannot be operated, unless the support arm 104 is at its maximum raised position. The support arm 104 can comprise a counterbalance mechanism that applies a force to move the mount portion 111 upward to counterbalance the weight of the display 102. With the support arm 104 in the upper-most raised position, the counterbalance does not need to release energy and move the support arm 104 upward as the display 102 is removed from the mount portion 111.

The second recess 1408 can be positioned on the groove 1404 opposite the first recess 1406. Accordingly, the second recess 1408 can be configured to receive the second pin 134 which is positioned opposite the first pin 132 on ridge 130.

When the mounting portion 111 is positioned in the recess 1400, the display 102 can be rotated between landscape and portrait orientations with the second pin 134 moving within the second recess 1408. In landscape orientation, the second pin 134 is positioned near the first end 1430 of second recess 1408, and in portrait orientation, the second pin 134 is near the second end 1432. The shape of the second recess 1408 can ensure that the display 102 is only rotated in one direction when moving from the landscape to portrait orientations (e.g., counterclockwise when viewed from the front of the display 102) and in the opposite direction when moving from portrait to landscape. An attempt to rotate the display 102 in the wrong direction can cause interference between a side of the second recess 1408 and the second pin 134. The circumferential length of the second recess 1408 can be about one fourth of the central circumference of the groove 1404, which corresponds to about 90 degrees of rotation of the display 102 relative to the mounting portion 111. The second recess 1408 and second pin 134 can be referred to as a pin-and-slot feature for controlling rotation of the display relative to the mount portion.

The outer face 1410 can comprise a generally flat surface that is parallel to or in-plane with the central face 1402. The outer face 1410 can comprise a high-friction material relative to the groove 1404 and relative to the central face 1402. For example, the outer face 1410 can comprise a silicone or rubber elastomeric covering that generates relatively high friction when pressed against the outer surface 136. The high-friction material can help prevent relative sliding between the display 102 and the mounting portion 111 and can reduce scratching or marring of rear surfaces of the display 102. The high-friction material can be referred to as a friction pad and can be attached to the outer face 1410. The underlying material of the housing 1420 at the outer face 1410 can comprise aluminum except for recesses 1412, 1414 which can comprise steel.

The third recess 1412 can be positioned on the outer face 1410 and can be substantially similar in size to the third pin 138. The third recess 1412 can therefore receive the third pin 138 when the display 102 is in the landscape orientation. The sidewalls of the third recess 1412 can prevent the display 102 from rotating to a portrait orientation due to contacting the third pin 138. Accordingly, when the user wishes to rotate the display 102 to portrait orientation, the release mechanism 156 can be operated to move ramped surface 166 (see FIG. 12) in a manner causing the withdrawal of the third pin 138 relative to the outer surface 136. The withdrawal of the third pin 138 can remove the third pin 138 from the third recess 1412, thereby removing its ability to prevent rotation of the display 102 relative to the central axis Y.

The fourth recess 1414 is also positioned on the outer face 1410 at a position circumferentially spaced away from the third recess 1412. The fourth recess 1414 can be positioned at a circumferential distance of about one-fourth of the central circumference of the outer face 1410, which corresponds to about 90 degrees of rotation of the display 102 relative to the mounting portion 111. Accordingly, since the third recess 1412 aligns with the third pin 138 in landscape orientation, the fourth recess 1414 aligns with the third pin 138 in portrait orientation since portrait orientation is about 90 degrees rotated relative to landscape. In this manner, the third pin 138 can prevent rotation of the display 102 relative to the mounting portion 111 while the display 102 is in portrait orientation. In order to move the display 102 back to landscape orientation, the release mechanism 156 can be triggered to withdraw the third pin 138 out of the fourth recess 1414 so that the display 102 can return to a position where the third pin 138 is in the third recess 1412 again.

The at least one laterally-extending recess 1416 (i.e., lateral recess) can extend circumferentially around substantially the entire circumference of the recess 1400. The lateral recess 1416 can receive the latches 122, 124, 126 when the display 102 is mated with the mounting portion 111.

Figure 16:
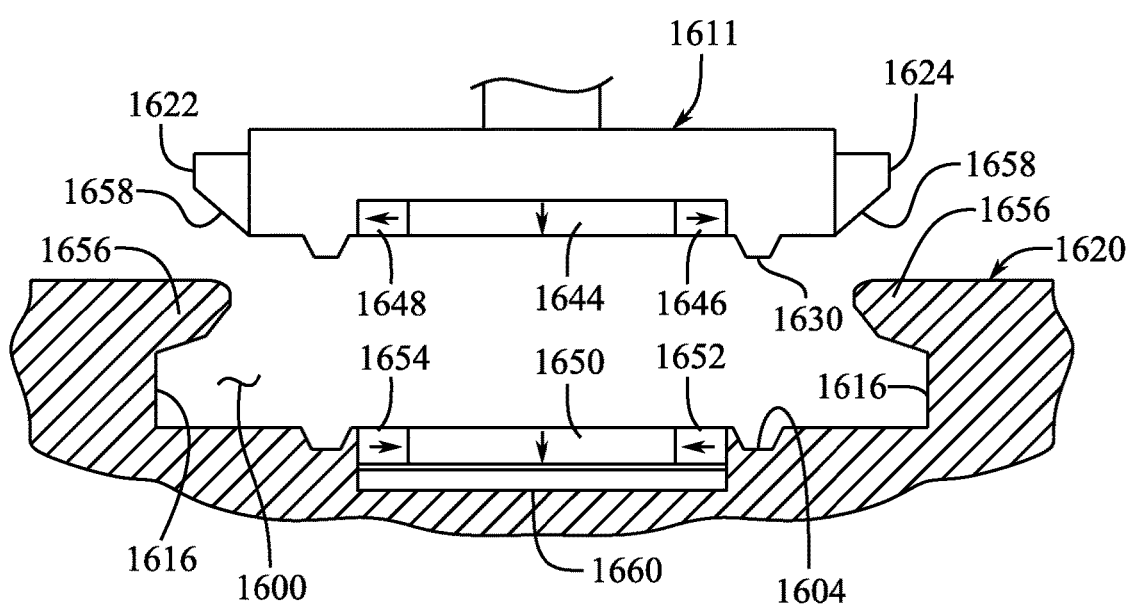
FIG. 16 shows a diagrammatic side section view of a mounting portion and a recess of a display housing.
Figure 17:
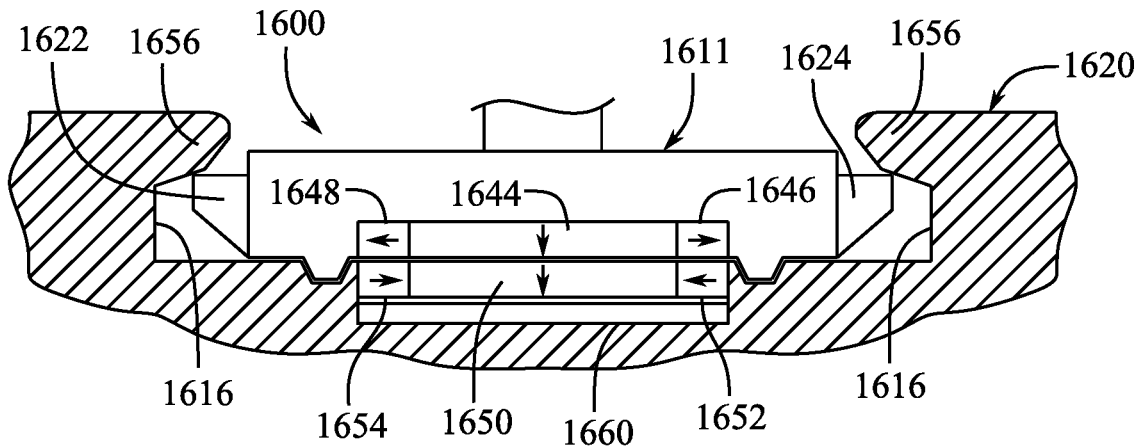
FIG. 17 shows a diagrammatic side section view of the mounting portion and recess of FIG. 16 with the mounting portion inserted into the recess.

FIGS. 16-17 show diagrammatic side views of a mounting portion 1611 interacting with a recess 1600 in a housing 1620 of a display. Some features of the mounting portion 1611 and housing 1620 are omitted or simplified in these views as compared with mounting portion 111 and housing 1420. However, the mounting portion 111 and housing 1420 can operate similar to mounting portion 1611 and housing 1620. As the recess 1600 approaches the mounting portion 1611, the magnetic structures 1644, 1646, 1648, 1650, 1652, 1654 can be attracted to each other and can align the center of the mounting portion 1611 with the center of the recess 1600. The latches 1622, 1624 of the mounting portion 1611 can be extended relative to the sides of the mounting portion 1611. The latches 1622 can correspond in function to the latches 122, 124, and 126.

The mounting portion 1611 can contact the housing 1620 with the latches 1622, 1624 contacting at least one ledge or lip 1656. The lip 1656 can extend radially inward over the laterally-outward-extending recess 1616. Front surfaces 1658 of the latches 1622, 1624 can be sloped or curved in a manner that, when there is contact between the front surfaces 1658 and the lip 1656, the latches 1622, 1624 can retract relative to the housing of the mounting portion 1611. In some embodiments, the front surfaces 1658 are sloped at about a 15-degree angle rearward relative to the plane of the central face 128. The front surfaces 1658 and the edge face 140 can be sloped in a manner wherein if those surfaces 140, 1658 contact the outer rim of the lip 1656 off-center, their narrowed central diameters can guide the mounting portion 1611 into central alignment with the recess 1600 similar to a funnel.

As the mounting portion 1611 continues to enter the recess 1600, the latches 1622, 1624 fully retract until they are at an axial depth in the recess 1600 corresponding to the laterally-outward-extending recess 1616. At that depth, they can spring back radially outward due to biasing structures (e.g., 182, 188) acting on the latches. Therefore, the latches 1622, 1624 can retain the mounting portion 1611 within the recess 1600 by mechanical interference with the lip 1656. The laterally-outward-extending recess 1616 can extend circumferentially around the recess 1600 under the lip 1656 so that the housing 1620 can rotate relative to the mounting portion 1611 while the latches 1622, 1624 retain the display to the mounting portion 1611. The ridge 1630 and groove 1604 can also be mated with each other when the mounting portion 1611 is fully inserted into the recess 1600 in a manner that keeps the mounting portion 1611 from sliding laterally relative to the lip 1656.

When the display 102 is mated with the mounting portion 111, the latches 122, 124, 126 can be positioned in the lateral recess 1416 below a lip 1456 extending around the recess 1400. See FIGS. 14-15. The display 102 can rotate about the central axis Y with the latches 122, 124, 126 secured by the lip 1456.

Magnetic structures 1644, 1646, 1648, 1650, 1652, 1654 can also be in a state of low or minimum potential energy (i.e., next to each other) when the mounting portion 1611 is inserted into the recess, and those magnetic structures can provide resistance to longitudinal withdrawal of the mounting portion 1611 from the recess 1600. As shown in FIG. 17, central magnetic structures 1644, 1650 and peripheral magnetic structures 1646, 1648, 1652, 1654 can be positioned next to similar structures having opposite polarity. A ferrous plate 1660 can be positioned next to magnetic structures 1650, 1652, 1654 on an internal side thereof. The ferrous plate 1660 can at least partially help to redirect the magnetic flux of the magnetic structures 1650, 1652, 1654 away from the inside of the display housing 1620 and outward toward the recess 1600. A similar ferrous plate can be positioned on the inner side of the magnetic structures 1644, 1646, 1648 of the mounting portion 1611 to perform a similar flux forming function.

Figure 18:
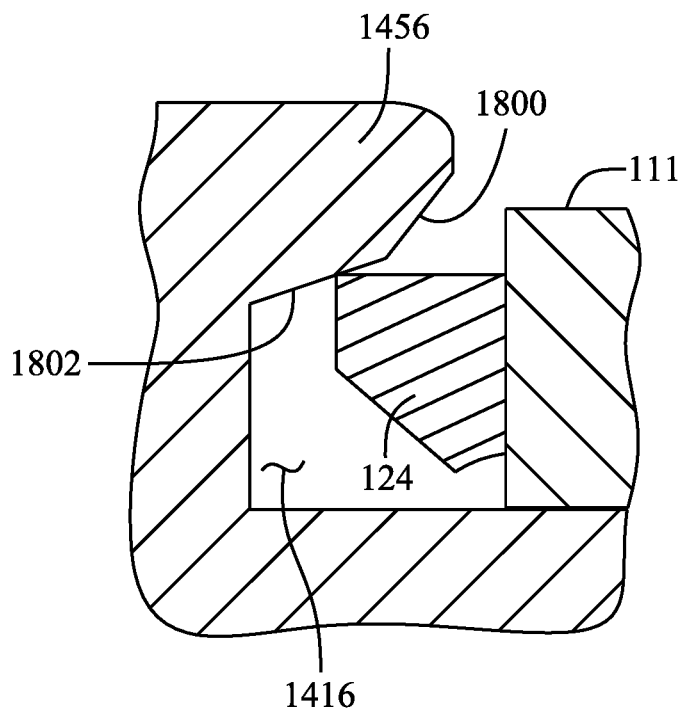
FIG. 18 shows a side section view of a lateral recess and a latch.

As shown in FIG. 18, the second latch 124 can be positioned under a latch retention surface 1802 of the lip 1456 when the mounting portion 111 is fully inserted into the recess 1400. As described above, operating the release mechanism 156 can retract the latches 122, 124. The second latch 124 can have its pin 176 held in the notch 186 in a manner that keeps the release mechanism 156 from resetting via the biasing structures 190, 192. Therefore, the lip 1456 can comprise an inner-facing ramped portion 1800 as shown in the diagrammatic side section view of FIGS. 18-20.

Figure 19:
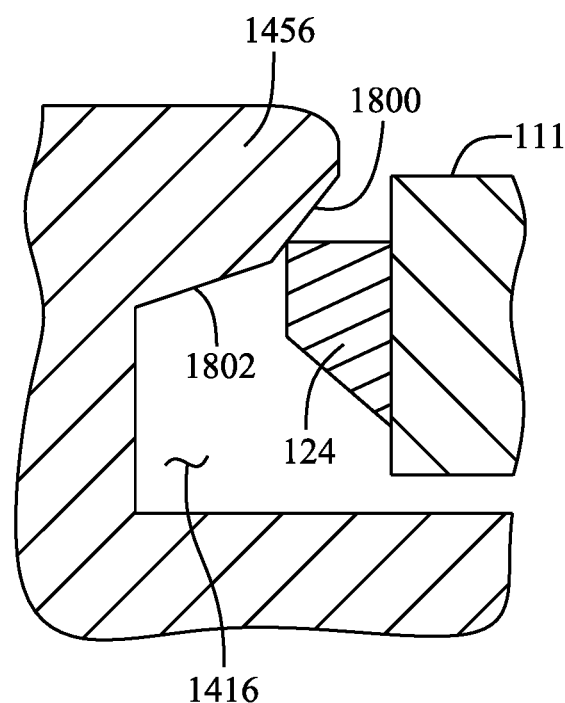
FIG. 19 shows a side section view of a lateral recess and a latch in a partially withdrawn configuration relative to FIG. 18.
Figure 20:
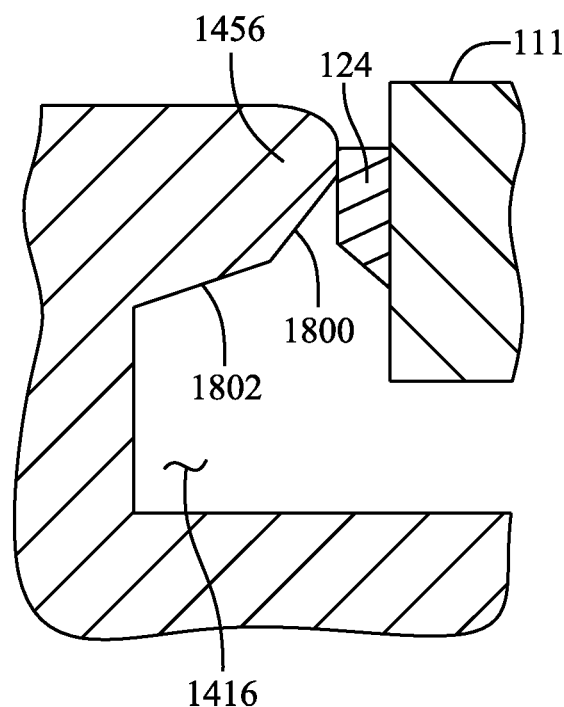
FIG. 20 shows a side second view of a lateral recess and a latch in a further withdrawn configuration relative to FIG. 19.

The latch 124 can be partially radially inwardly withdrawn by operation of the release mechanism 156, and this partial withdrawal can move the latch 124 from a radially-external position wherein the latch 124 contacts a non-ramped latch retention surface 1802 (see FIG. 18) to a position next to the ramped portion 1800 (see FIG. 19). With the latch 124 contacting the ramped portion 1800 and with a longitudinal withdrawal force applied to the display 102, the lip 1456 can urge the latch 124 radially inward further than the release mechanism 156, thereby moving the pin 176 radially inward and allowing the release mechanism 156 to reset. However, once the second latch 124 is in contact with the ramped portion 1800, the first latch 122 is already contacting the lip 1456. Therefore, the latches 122, 124 are constrained by the lip 1456 from extending back radially outward under the lip 1456. See FIG. 20. The user can therefore pull the display 102 away from the mounting portion 111 by pulling along the central axis Y while pivoting the top of the recess 1416 upward and away from the third latch 126. In this manner, removing the display 102 from the mounting portion 111 can automatically reset the release mechanism 156. Thus, the release mechanism 156 is immediately able to latch to a display again after a display (e.g., 102) is removed.

Referring again to FIGS. 14-15, the lateral recess 1416 can have a bottom end portion 1418 wherein the lateral recess 1416 does not extend as far from the central axis Y as other portions of the lateral recess 1416. When the display 102 is positioned in landscape orientation, the second latch 124 is positioned in the lower left section of the lateral recess 1416 as seen in FIG. 14. When preparing to rotate to portrait orientation, the user can trigger the release mechanism 156, thereby partially withdrawing the second latch 124 until the second pin 176 is within notch 186 and the first and third pins 132, 138 are withdrawn. Accordingly, the display 102 can be turned about the central axis Y. Through that motion, the bottom end portion 1418 can rotate about 90 degrees clockwise in FIG. 14 while the second latch 124 remains stationary. The bottom end portion 1418 can have a first ramp 1458 that therefore comes into contact with the second latch 124 as the display 102 is rotated to portrait orientation. The first ramp 1458 gradually pushes in the second latch 124 in a manner that moves the second pin 176 inward relative to the notch 186 and releases the rotatable ring 162. Accordingly, the release mechanism 156 can automatically reset (via the biasing structures 190, 192) while the display 102 is rotated from landscape orientation to portrait orientation. With the release mechanism 156 reset, the latches 122, 124 can automatically re-extend and keep the display 102 on the mounting portion 111 in portrait orientation.

In similar fashion, when the display 102 is in portrait orientation, the release mechanism 156 can be operated to withdraw the third pin 138 in a manner permitting the display 102 to move about the central axis Y while still engaging the mounting portion 111. Triggering the release mechanism 156 again traps the pin 176 in the notch 186. Rotating a second ramp 1460 of the bottom end portion 1418 of the lateral recess 1416 against the second latch 124 therefore pushes in the second latch 124 and resets the release mechanism 156. In other words, the second ramp 1460 moves from a position on the left side of FIG. 14 to a bottom side of FIG. 14 and, in that movement, contacts and pushes the second latch 124 radially inward. Accordingly, the release mechanism 156 can automatically reset while the display 102 is rotated from portrait orientation to landscape orientation. With the release mechanism 156 reset, the latches 122, 124 can automatically re-extend and keep the display 102 on the mounting portion 111 in landscape orientation.

Figure 21:
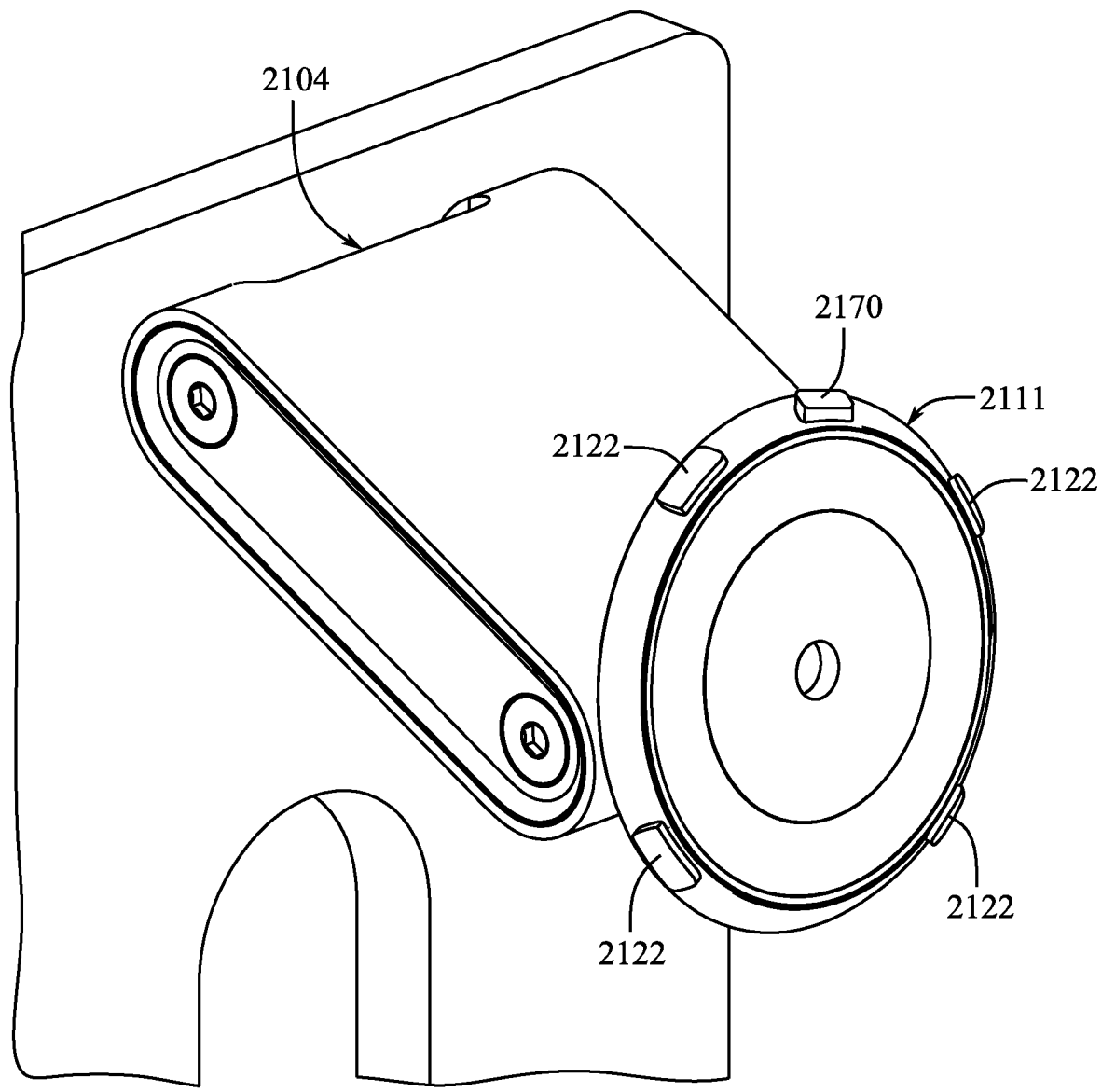
FIG. 21 shows an isometric view of a support arm.

FIG. 21 shows an isometric view of a support arm 2104 having an alternate embodiment of a mounting portion 2111. In this embodiment, the mounting portion 2111 comprises four circumferentially spaced apart and radially-retractable latches 2122 that can function similar to first latch 122. The mounting portion 2111 also has a non-retractable latch 2170 positioned at a top end. Accordingly, four retractable latches can be implemented on a mounting portion 2111. Not all of the latches are equally spaced apart, as shown by the non-retractable latch 2170 being closer to two of the other latches 2122. The non-retractable latch 2170 can require a display to be rotated or tilted relative to the mounting portion 2111 in order for the latch 2170 to be rotated under a lip in a rear recess of the display. In some variations, the mounting portion 2111 can comprise more or fewer than four retractable latches 2122.

Figure 22:
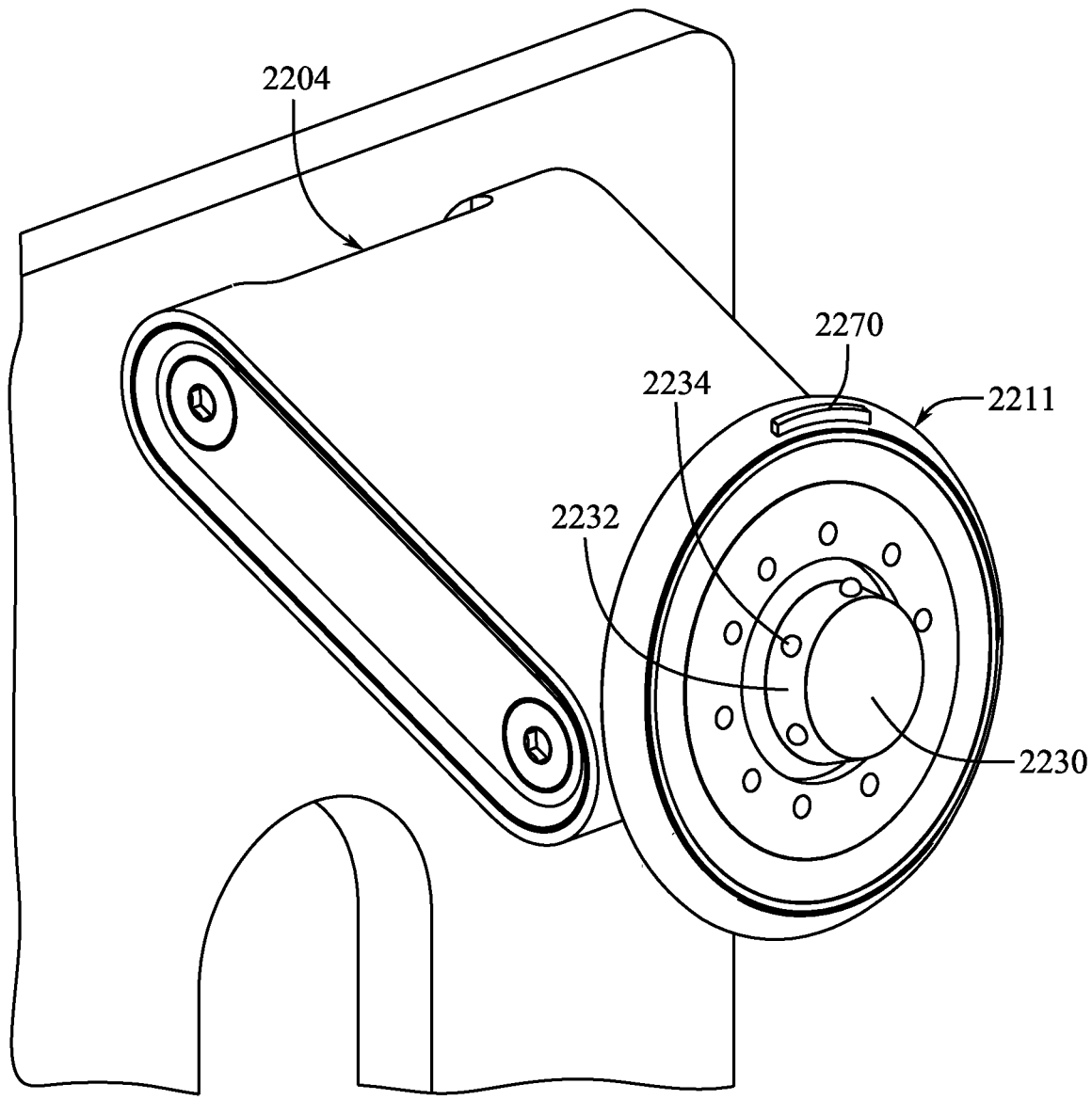
FIG. 22 shows an isometric view of a support arm.

FIG. 22 shows an isometric view of a support arm 2204 having an alternate embodiment of a mounting portion 2211. In this embodiment, the mounting portion 2211 can comprise a central protrusion 2230 with a side surface 2232 in which a set of six radially-retractable pins 2234 are positioned. The set of pins 2234 can be radially retractable in response to actuation of a release mechanism similar to mechanism 156. The pins 2234 can have circular end surfaces, wherein insertion of the protrusion 2230 into a similarly-sized recess in the display can cause the pins 2234 to be pressured inward by a lip of the recess. The pins 2234 can be biased radially outward, wherein once the protrusion 2230 is fully inserted into the recess, the pins 2234 can return to the extending position shown in FIG. 22. In some configurations, the pins 2234 can be ball bearings, and the pins 2234 can therefore roll in position on the protrusion 2230 in a manner that reduces friction between the protrusion 2230 and a recess lip into which the protrusion 2230 is inserted.

Figure 23:
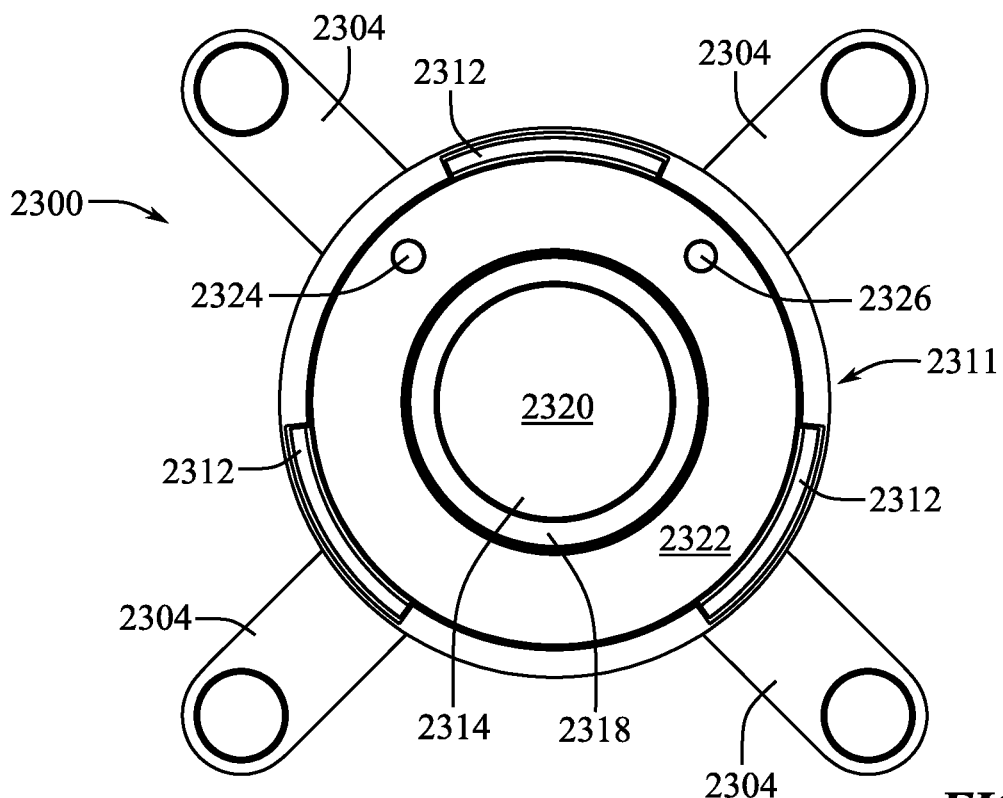
FIG. 23 shows an inside view of a display mounting adapter.
Figure 24:
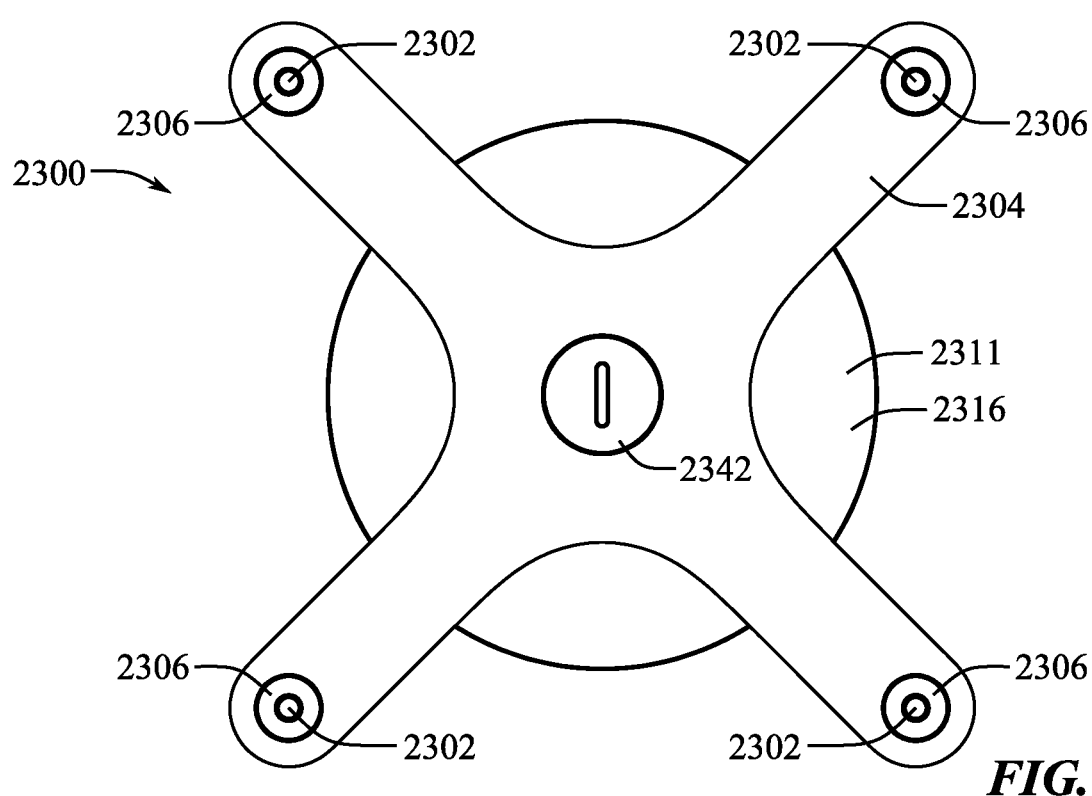
FIG. 24 shows an outside view of the display mounting adapter of FIG. 23.

FIGS. 23-30 show various features of another embodiment of a display mounting device. The display mounting device can be referred to as a display mounting adapter 2300 that allows a display having the features of display 102 to be attached to and supported by a generic support arm. For example, the display mounting adapter 2300 can be used to mount the display 102 to a standard VESA mount having four mounting points spaced at predetermined or standardized positions (e.g., a 200 by 200 millimeter square, a 400 by 400 mm square, a 400 by 200 mm rectangle, or another standard size). FIG. 23 shows an inside (i.e., front side or front-facing) view of the display mounting adapter 2300, and FIG. 24 shows an outside (i.e., back side or rear-facing) view thereof.

The mounting points of the generic support arm can be spaced apart in a manner that corresponds to the mounting points 2302 on a mounting plate 2304 of the mounting adapter 2300. See FIG. 24. The mounting points 2302 can be threaded openings in the mounting plate 2304 (or in inset receptacles 2306 of the mounting plate) to receive fasteners that extend through or from the generic support arm.

The display mounting adapter 2300 can comprise a mounting portion 2311 having a shape comparable to mounting portion 111 and configured to extend into a similar recess (e.g., 1400) of the display 102. The mounting portion 2311 can comprise three latches 2312 that are radially movable between an unlocked or retracted configuration (shown in FIGS. 23-26) and a locked or extended configuration (shown in part in FIG. 29). In the locked or extended configuration, the latches 2312 extend from an edge face 2340 of the mounting portion 2311, similar to the latches 122, 124, 126 of FIG. 9 extending from edge face 140. Thus, the latches 2312 can be positioned within recess 1400 and can be retained by a lip 1656. When in the unlocked or retracted configuration, the latches 2312 can be withdrawn to a radial size that allows the mounting portion 2311 to be removed from the recess 1400.

The mounting portion 2311 can comprise a front plate 2314 (see FIG. 23) and a back plate 2316 (i.e., rear housing; see FIG. 24). The front plate 2314 can comprise a raised ridge or retention ring 2318 that protrudes forward from an inner face 2320 and an outer face 2322 that have sizes and functions similar to corresponding components of mounting portion 111. The outer face 2322 can be covered with a high friction material. The front plate 2314 can have openings through which two clocking protrusions 2324, 2326 can extend.

Figure 25:
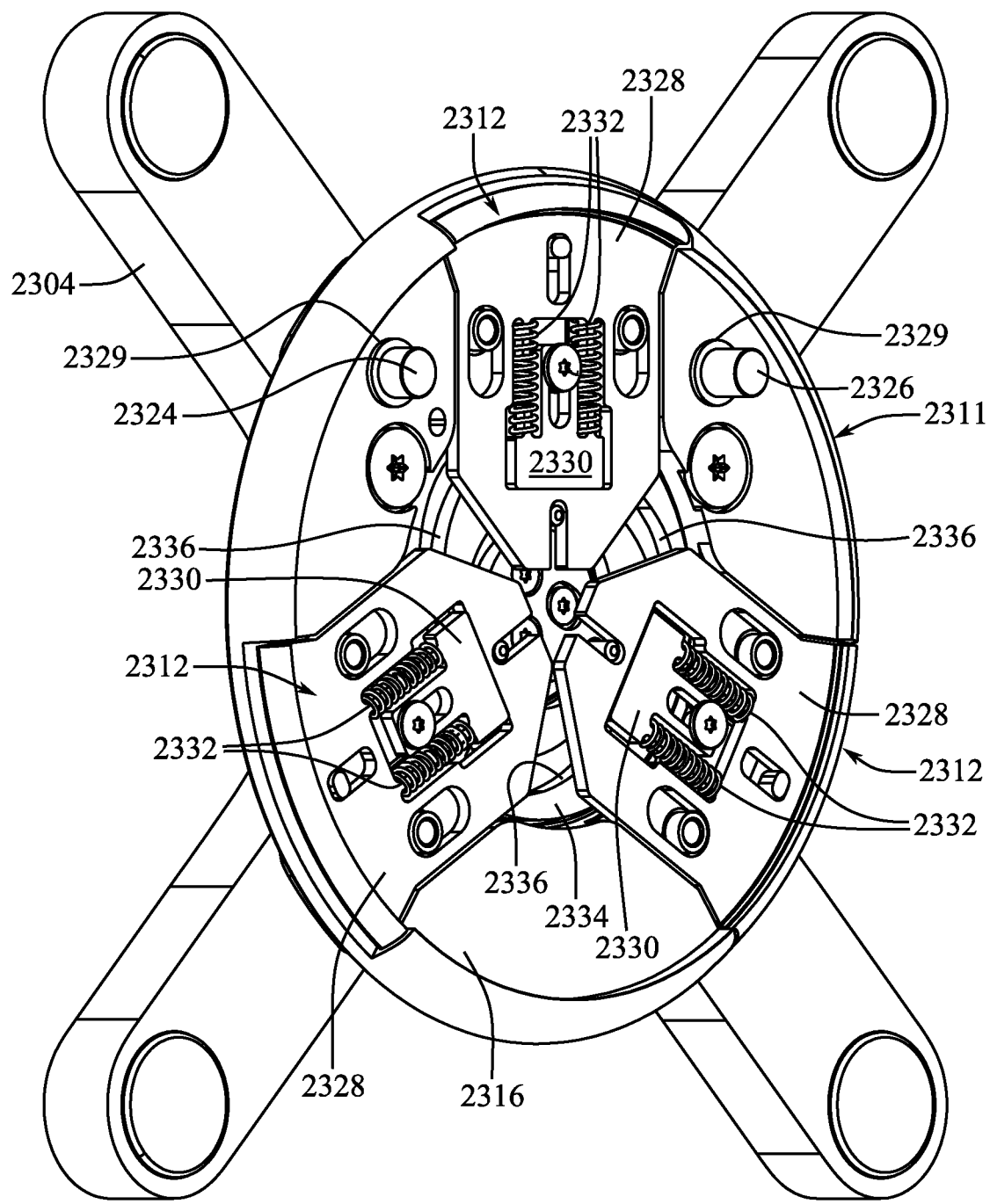
FIG. 25 shows an isometric view of the display mounting adapter of FIG. 23 with certain components omitted.
Figure 26:
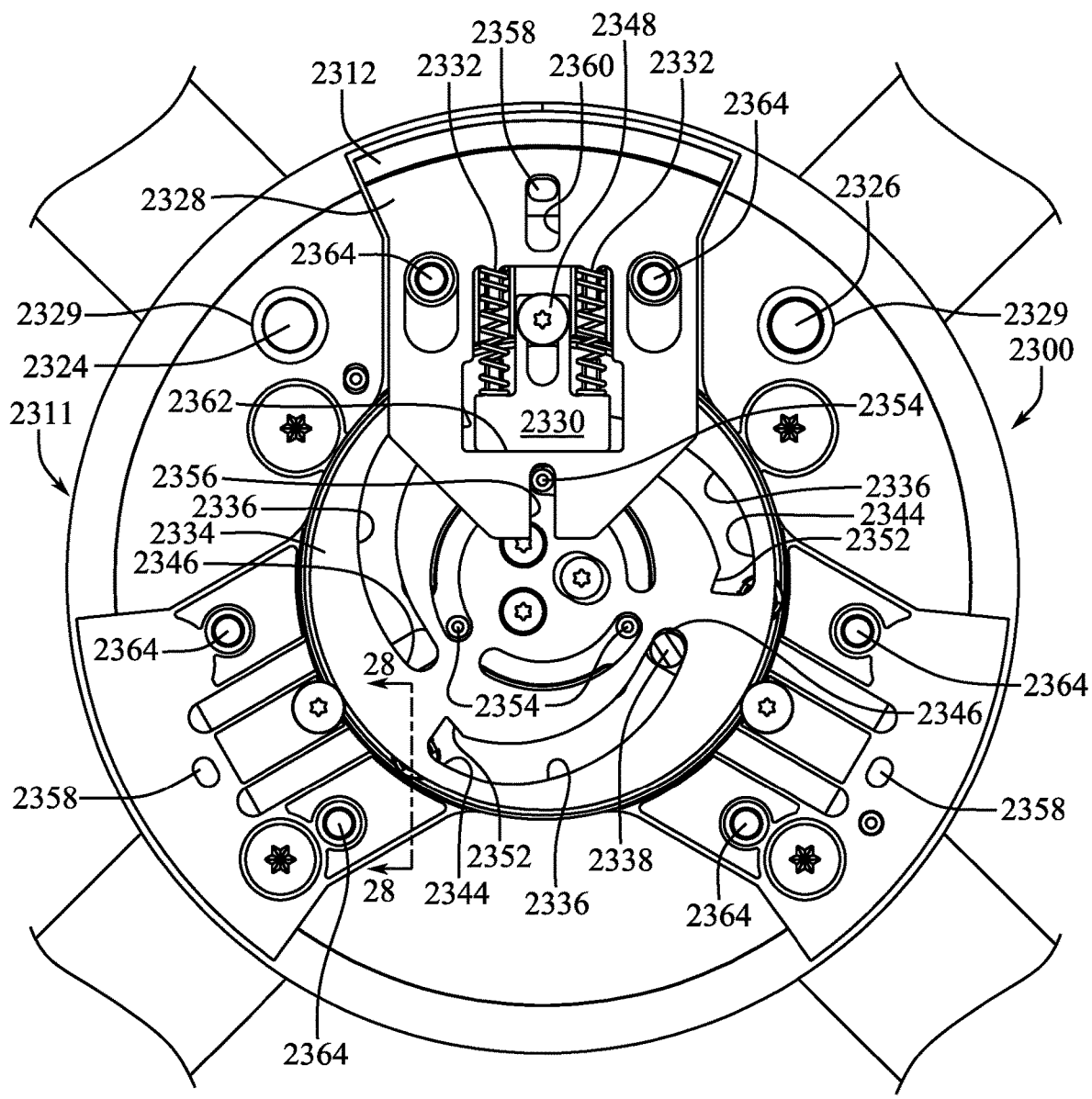
FIG. 26 shows an inside view of the display mounting adapter of FIG. 23 with certain components omitted.
Figure 27:
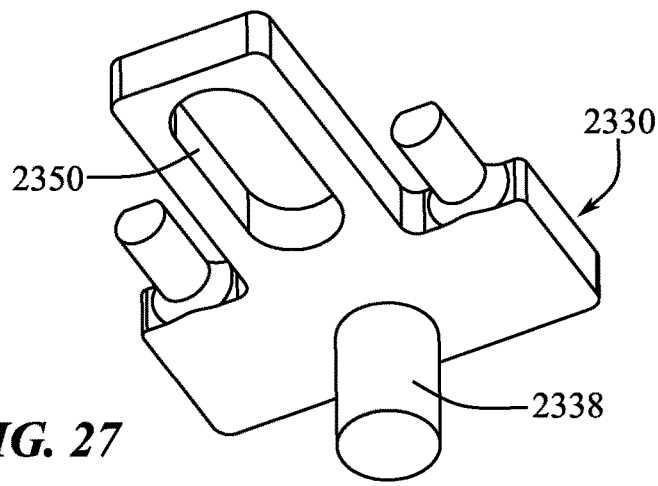
FIG. 27 shows an isometric view of a cam follower of the display mounting adapter of FIG. 23.

FIG. 25 shows an isometric view of the display mounting adapter 2300 with the front plate 2314 omitted. FIG. 26 shows a front end view of the mounting portion 2311 with the front plate 2314 and two lower latches 2312 omitted. The latches 2312 can each comprise an outer body 2328, an inner body 2330, and a pair of biasing devices 2332. The latches 2312 can interact with a rotatable cam 2334 at the center of the mounting portion 2311, as described below.

The rotatable cam 2334 can have a set of radially spiraling cam openings 2336, wherein one cam opening 2336 is provided for each latch 2312. The inner body 2330 of the latch 2312 can have a cam follower stem 2338 (see FIG. 27 which shows an isometric rear view of the inner body 2330) that extends longitudinally inward from the inner body 2330 into and through the cam opening 2336. A follower stem 2338 is shown in the lower right portion of FIG. 26 that is isolated from the rest of its associated inner body to illustrate its interaction with the cam opening 2336.

The cam 2334 can be rotated about the longitudinal axis (similar to axis L) of the mounting portion 2311 upon rotation of a rotatable toggle 2342 on the back of the mounting plate 2304. See FIG. 24. The rotatable toggle 2342 can be rotated between a first, unlocked position (shown in FIG. 24) and a second, locked position that is 90 degrees rotated clockwise about the longitudinal axis relative to the first, unlocked position. The cam 2334 is in the unlocked position in FIG. 26 and is in the locked position in FIG. 29.

Figure 29:
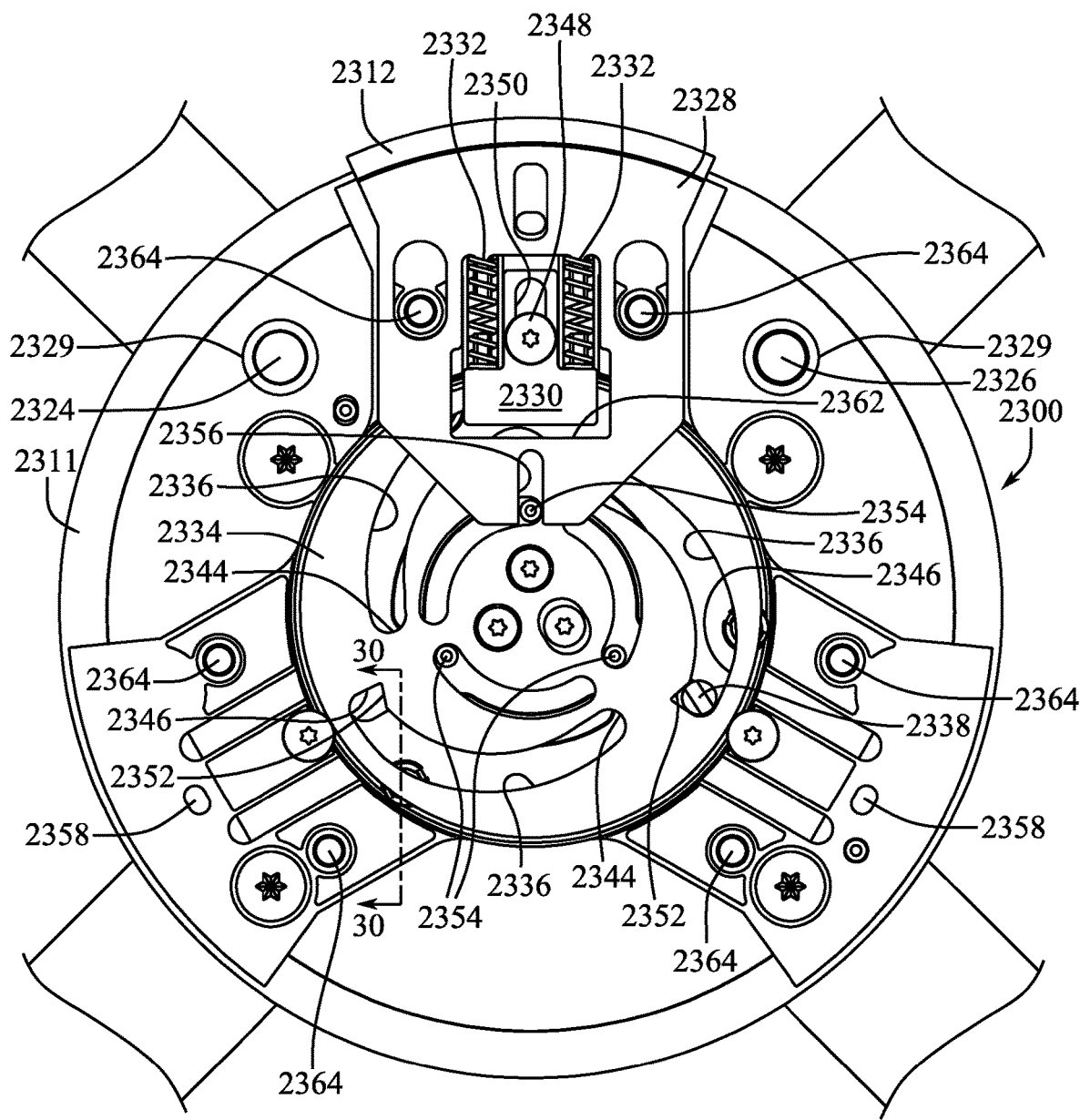
FIG. 29 shows an inside view of the display mounting adapter of FIG. 23 with certain components omitted and the adapter being in a locked state.

Each cam opening 2336 can have a width sufficient to receive the diameter or width of the follower stem 2338. As the cam 2334 rotates, the follower stems 2338 can contact the sides of the spiral shapes of the cam openings 2336 and slide along the cam openings 2336 radially inward or outward. Counterclockwise motion of the cam 2334 (as viewed in FIG. 26) can move the follower stems 2338 (and accordingly the inner bodies 2330 of the latches 2312) radially outward, and clockwise motion of the cam 2334 (as viewed in FIG. 29) can move the follower stems radially inward. The cam openings 2336 can each comprise a locked end 2344 and an unlocked end 2346. When a follower stem 2338 is positioned at the locked end 2344, the latch 2312 can be in the extended or locked position (as shown in FIG. 29), and when the follower stem 2338 is at the unlocked end 2346, the latch 2312 can be in the retracted or unlocked position.

The movement of the inner body 2330 is defined by the movement of the follower stem 2338 on the inner body 2330 relative to the cam openings 2336 and by interference with a post 2348 that extends through a guide slot 2350 on the inner body 2330. See FIGS. 26-27. The inner body 2330 can also contact the pair of biasing devices 2332 that bias the outer body 2328 of each latch 2312 away from the inner body 2330. The biasing devices 2332 can also ensure that the inner body 2330 is biased into contact with an inner radial surface of each cam opening 2336.

At the unlocked end 2346 of each cam opening 2336, a detent 2352 can be formed on the radially inward surface of the cam opening 2336. Accordingly, as the cam 2334 is rotated by the rotatable toggle 2342, the cam followers 2338 can slide along the inner radial surface of each cam opening 2336 while gradually moving radially outward. Upon reaching the unlocked end 2346, the cam followers 2338 can be biased and moved slightly radially inward into the detents 2352. The biased movement of the cam followers 2338 can give a "click" feel or similar feedback to the user turning the rotatable toggle 2342 to indicate by touch or tactile vibration that the cam 2334 has been completely rotated to its extreme locked rotated position. The detent 2352 can also provide some minor resistance to rotating the cam 2334 back to the unlocked rotated position. Turning the cam 2334 toward the unlocked position can require the user to input a sufficient torque to the toggle 2342 to cause the cam followers 2338 to overcome the radially-inwardly-directed biasing forces applied by the biasing devices 2332 so that they move radially outward from the detents 2352 and into the rest of the cam openings 2336.

The movement of the inner body 2330 and the biasing forces applied by the biasing devices 2332 can control the movement of the outer body 2328 of each latch 2312. Outer bodies 2328 can radially translate and can each be constrained to only translate radially by a round pin 2354 on the back plate 2316 that fits within a narrow slot 2356 on the outer body 2328 and a second, lozenge-shaped pin 2358 on the back plate 2316 that fits within a second, wider slot 2360 on the outer body 2328. See FIGS. 25-26 and 29. The round pins 2354 can extend through the cam 2334.

The inner body 2330 can be positioned within an aperture or recess of the outer body 2328. When the inner body 2330 moves from the locked position to the unlocked position, it can contact a sidewall 2362 of the aperture and thereby push the outer body 2328 radially inward as it moves radially inward. Accordingly, the inner body 2330 can move the outer body 2328 inward to the unlocked position. While it approaches the sidewall 2362, the inner body 2330 can permit a small amount of extension of the biasing devices 2332, as shown by comparing the lengths of the biasing devices 2332 in FIGS. 26 and 29.

The outer body 2328 can be constantly biased radially outwardly away from the center of the mounting portion 2311 by the biasing devices 2332 and can be drawn radially inward as the inner body 2330 moves radially inward. The radial distance from the central longitudinal axis of the mounting portion 2311 to the unlocked ends 2346 can therefore be small enough to cause the inner body 2330 to move into contact with the outer body 2328. If it were not small enough, the inner body 2330 could "float" within the outer body 2328 without the outer body 2328 moving. This "floating" feature can beneficially prevent the outer body 2328 from retracting radially inward when the rotatable toggle 2342 only makes a small amount of rotation from the locked to the unlocked position. Instead, the toggle 2342 needs to be rotated a sufficient portion of its overall travel range in order for the inner body 2330 to be pulled in far enough to contact the sidewall 2362 and to begin to retract the outer body 2328.

Each latch 2312 can also have a pair of bosses 2364 extending through the outer body 2328. The bosses 2364 can be positions where fasteners join the front plate 2314 and the back plate 2316. The bosses 2364 can extend through the outer body 2328 without contacting the outer body 2328. The bosses 2364 can be positioned through the outer body 2328 in order to ensure that they are sufficiently close to each other to limit bending of the front plate 2314. When the display mounting adapter 2300 is in the locked position, the latches 2312 can extend under a ledge or lip of the display recess. If the adapter 2300 is pulled longitudinally away from the display recess while in the locked state, the latches 2312 can contact the ledge or lip and can therefore mechanically interfere with and prevent the withdrawal of the adapter 2300. The latches 2312 are sandwiched between the front and back plates 2314, 2316, so an attempted withdrawal from the display recess can apply a force to the outer body 2328 that makes the outer body 2328 come into contact with the front or back plate. By having the bosses 2364 near each other and extending through the outer body 2328, that force applied to the front or back plate by the outer body 2328 is less likely to be able to sufficiently bend or bow the front or back plate 2314, 2316 in a manner that could break the plate or cause the outer body 2328 to slip out from between the plates. Accordingly, the width between the bosses 2364 can be less than the overall lateral width of the outer body 2328 through which they extend.

Figure 28:
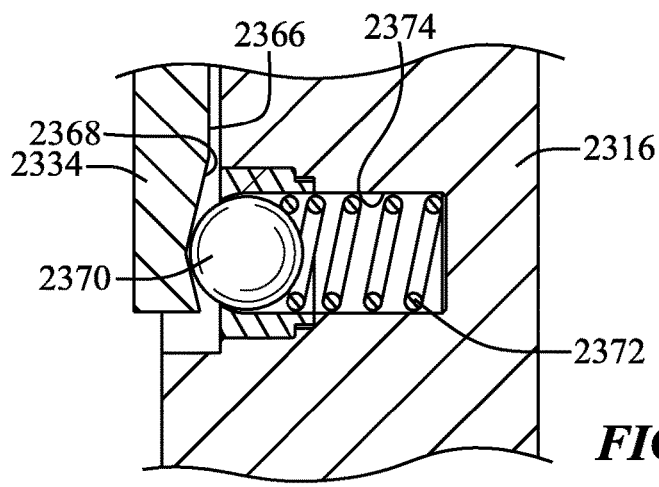
FIG. 28 shows a side section view taken through section lines 28-28 of FIG. 26.

The cam 2334 can also be biased at the extreme unlocked position. FIG. 28 shows a side section view of the cam 2334 and the back plate 2316 at section lines 28-28 in FIG. 26. The rear-facing surface 2366 can have a recessed detent 2368 in it that is configured to receive a biased ball 2370 housed by the back plate 2316 with a biasing device 2372 in a back plate recess 2374.

Figure 30:
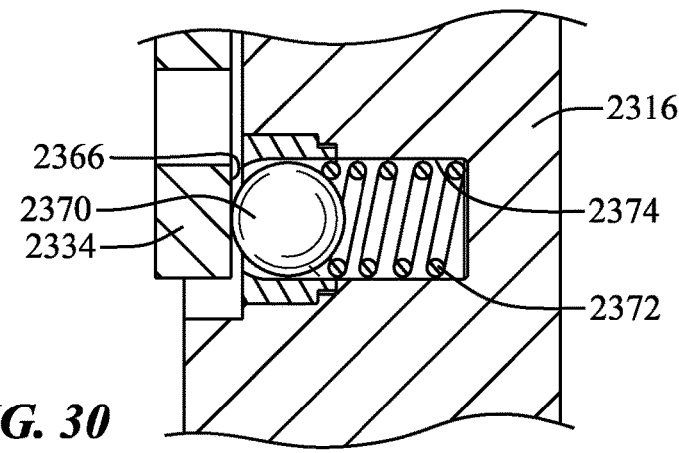
FIG. 30 shows a side section view taken through section lines 30-30 of FIG. 29.

FIG. 30 shows a similar section view (taken from section lines 30-30 in FIG. 29) wherein when the cam 2334 is not in the unlocked position (e.g., it is in the locked position), the recessed detent 2368 has been rotated out of alignment with the ball 2370 such that the ball 2370 is retracted relative to the position shown in FIG. 28. As a result, when the user rotates the toggle 2342 out of the unlocked position (e.g., to the position of FIG. 30), the user must apply sufficient torque to the toggle 2342 to overcome the biasing force provided to the ball 2370 by the biasing device 2372 and to retract the ball 2370 into the back plate 2316 out of the recessed detent 2368 and into contact with a flat portion of the rear-facing surface 2366. In this manner, the user can feel a "bump" or "click" feedback when moving into or out of the extreme unlocked position that is caused by movement of the ball 2370 relative to the cam 2334. Additionally, the biased ball 2370 can require a minimum torque to be applied to the toggle 2342 in order to move out of the unlocked position.

A ball 2370, biasing device 2372, and recess 2374 can be provided at multiple points around the cam 2334. In some embodiments, there are three such biasing features in the back plate 2316 and three corresponding recessed detents 2368 in the cam 2334. The detents 2368 can be circumferentially spaced around the circumference of the cam 2334 at positions about 120 degrees separated from each other.

A biasing device (not shown) can bias the second clocking protrusion 2326 away from the back plate 2316 in a longitudinal direction (i.e., toward the display recess 1400) similar to biasing device 2372. Accordingly, the second clocking protrusion 2326 can be biased into contact with a surface of the fourth recess 1414 of the display housing 1420. The second clocking protrusion 2326 and fourth recess 1414 can therefore provide a path for static electricity to pass between the adapter 2300 and the display housing 1420 (i.e., a chassis ground) by being in constant contact with each other while the adapter 2300 is mounted despite variations in dimensions due to manufacturing tolerances and movement between the devices. In some embodiments, the first clocking protrusion 2324 can also be biased away from the back plate 2316 in a longitudinal direction, similar to biasing device 2372. The first clocking protrusion 2324 can therefore be biased into contact with a surface of the third recess 1412. Bushings 2329 can laterally reinforce and longitudinally guide the movement of the first and second clocking protrusions 2324, 2326.

In some embodiments, the display mounting adapter 2300 can include the magnetic assembly 142. In some cases, the magnetic assembly 142 can be omitted. The magnetic assembly 142 can be optional since the display mounting adapter 2300 can be attached to the display 102 while the display 102 is at rest (e.g., face down on a support surface) rather than being carried by a user to be mounted to the display mounting adapter 2300. Alternatively, the magnetic assembly 142 can be included so that a generic support arm can have the display mounting adapter 2300 already positioned on it when the display 102 is moved to latch onto the display mounting adapter 2300.

Figure 31:
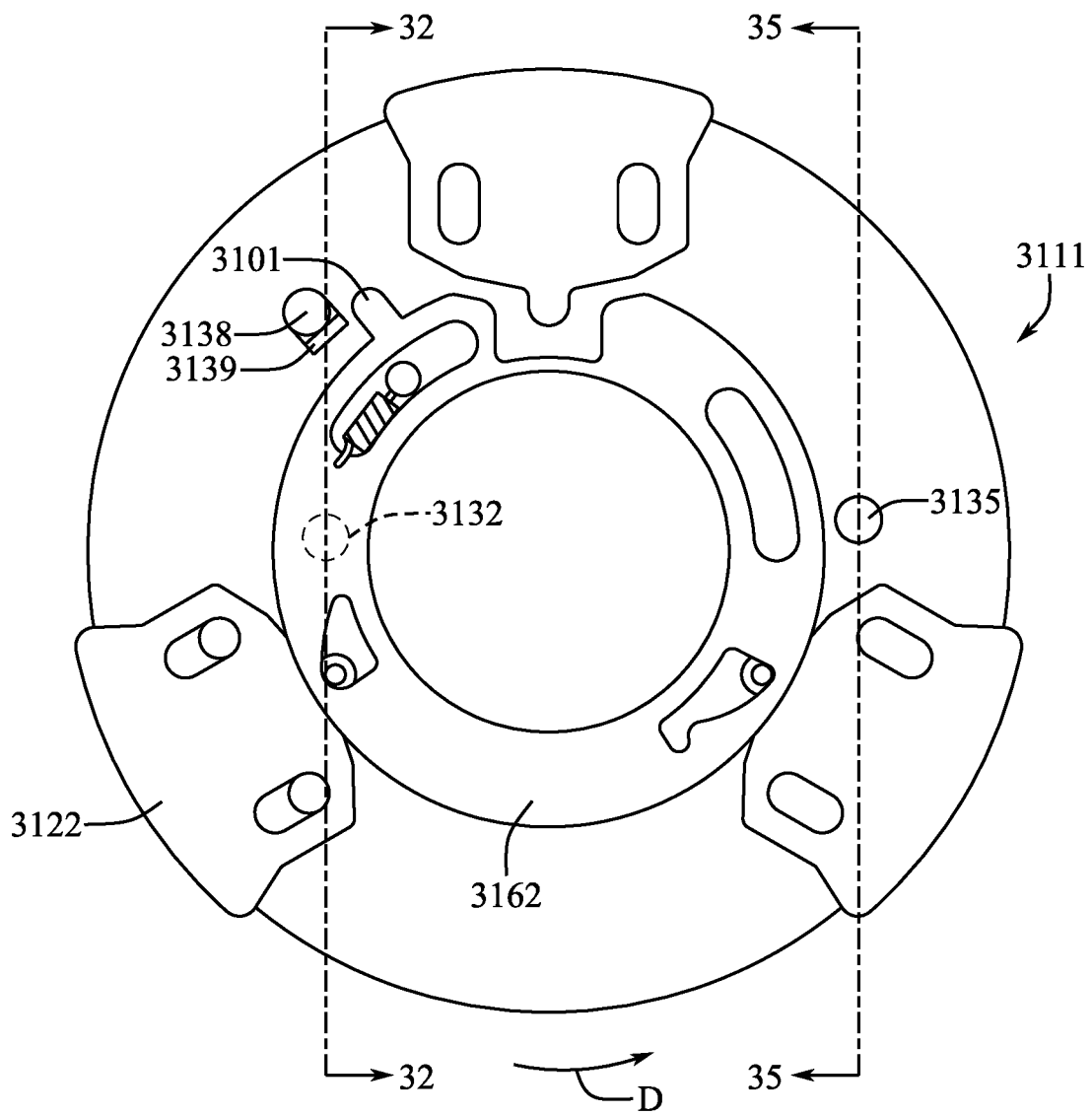
FIG. 31 shows a front end view of an alternate embodiment of a mounting portion of a support arm with some components omitted and with the mounting portion in a locked state.

FIG. 31 shows a front end view of another embodiment of a mounting portion 3111 of a support arm 3104 (see FIG. 32) with some components omitted and with the mounting portion in a locked state. Some parts, such as the front plate, have been omitted, and some parts have been simplified for this diagram. Parts of mounting portion 3111 having corresponding names to the parts of mounting portion 111 above can have corresponding functions.

Figure 33:
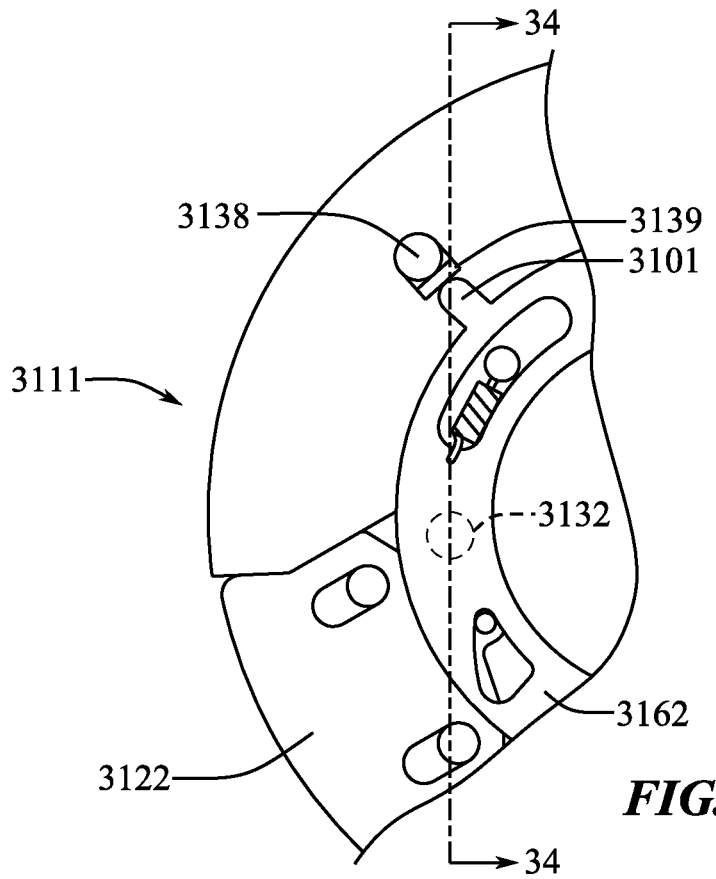
FIG. 33 shows a partial front end view of the mounting portion of FIG. 31 with the mounting portion in an unlocked state.

In FIG. 31, the rotatable ring 3162 can comprise a radial unlocking protrusion 3101 configured to rotate about the longitudinal axis (i.e., L) of the mounting portion 3111 upon operation of a release mechanism (e.g., 156). The radial unlocking protrusion 3101 can therefore rotate from a position out of contact with a retractable pin 3138, as shown in FIG. 31, to a position in contact with the pin 3138, as shown in FIG. 33. The rotatable ring 3162 can be biased into the rotated position shown in FIG. 31 by biasing devices similar to devices 190, 192.

The retractable pin 3138 can comprise an engagement surface 3139 configured to come into contact with the unlocking protrusion 3101. In some embodiments, the engagement surface 3139 can be a rounded, ramped, or sloped surface, wherein as the unlocking protrusion 3101 gradually comes into contact with the engagement surface 3139, the retractable pin 3138 can gradually be pushed longitudinally rearward (i.e., it can recede relative to the front plate) in a manner similar to how the third pin 138 recedes due to engagement with ramped surface 166. The retractable pin 3138 can be biased in a longitudinally forward direction, wherein rotation of the unlocking protrusion 3101 out of contact with the engagement surface 3139 can allow the retractable pin 3138 to return to its default, forward-extended position. Accordingly, the retractable pin 3138 can provide a similar function to the third pin 138 by extending into a recess 1412/1414 when in the locked state and by receding from the recess when the mounting portion 3111 transitions to the unlocked state.

Figure 32:
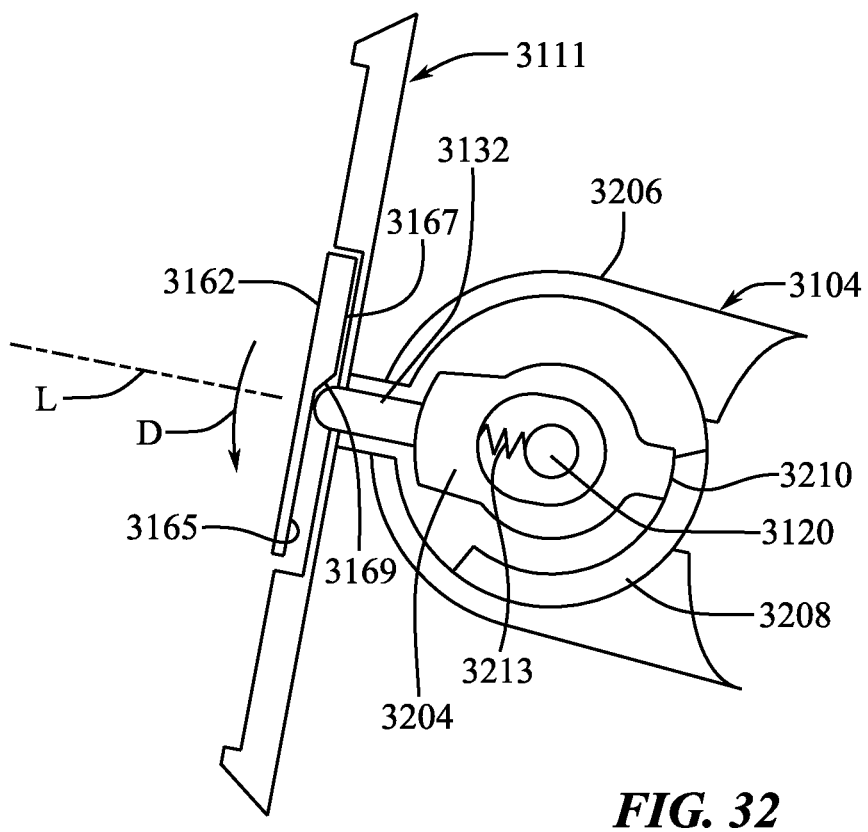
FIG. 32 shows a side section view of the mounting portion and support arm as taken through section lines 32-32 in FIG. 31.

Referring again to FIG. 31, the mounting portion 3111 can comprise an internal pin 3132 that extends through the back plate of the mounting portion 3111 behind the rotatable ring 3162. FIG. 32 shows a diagrammatic side section view of the mounting portion and support arm as taken through section lines 32-32 in FIG. 31 which extend centrally through the internal pin 3132. In FIG. 32, some parts are shown simplified or omitted to provide improved clarity. As shown in FIG. 32, the rotatable ring 3162 is positioned forward of the internal pin 3132. The internal pin 3132 extends from the mounting portion 3111 into the housing 3206 of the support arm 3104. The internal pin 3132 can contact a locking member 3204 (i.e., a locking key or biased lockout key).

With the support arm 3104 in a lowered position, as shown in FIG. 32, the locking member 3204 can be prevented from movement along longitudinal axis L due to contact between end portion 3210 and block 3208 of the housing 3206, similar to locking member 204 and block 208 of FIG. 11. The internal pin 3132 is accordingly also not translatable relative to the mounting portion 3111 along axis L because of its contact with the locking member 204.

As shown in FIG. 32, the rotatable ring 3162 can comprise a first portion of a rear surface 3165, a second portion of a rear surface 3167 having a different longitudinal position along axis L, and a ramped portion 3169 linking the two portions of the rear surface 3165, 3167. With the support arm 3104 in a lowered position, as shown in FIG. 32, the internal pin 3132 protrudes into the mounting portion 3111 to a longitudinal position forward of the second portion of the rear surface 3167. Accordingly, the rotatable ring 3162 is prevented from rotating in the direction D shown in FIG. 32 due to interference contact between the internal pin 3132 and the ramped portion 3169 of the rear surface. Direction D is also shown in FIG. 31. As a result, in the lowered position of the support arm 3104, the rotatable ring 3162 is prevented from rotating and the internal pin 3132 is prevented from retracting rearward along axis L. The mounting portion 3111 therefore cannot be changed to the unlocked configuration and cannot be removed from a display (e.g., 102).

Figure 34:
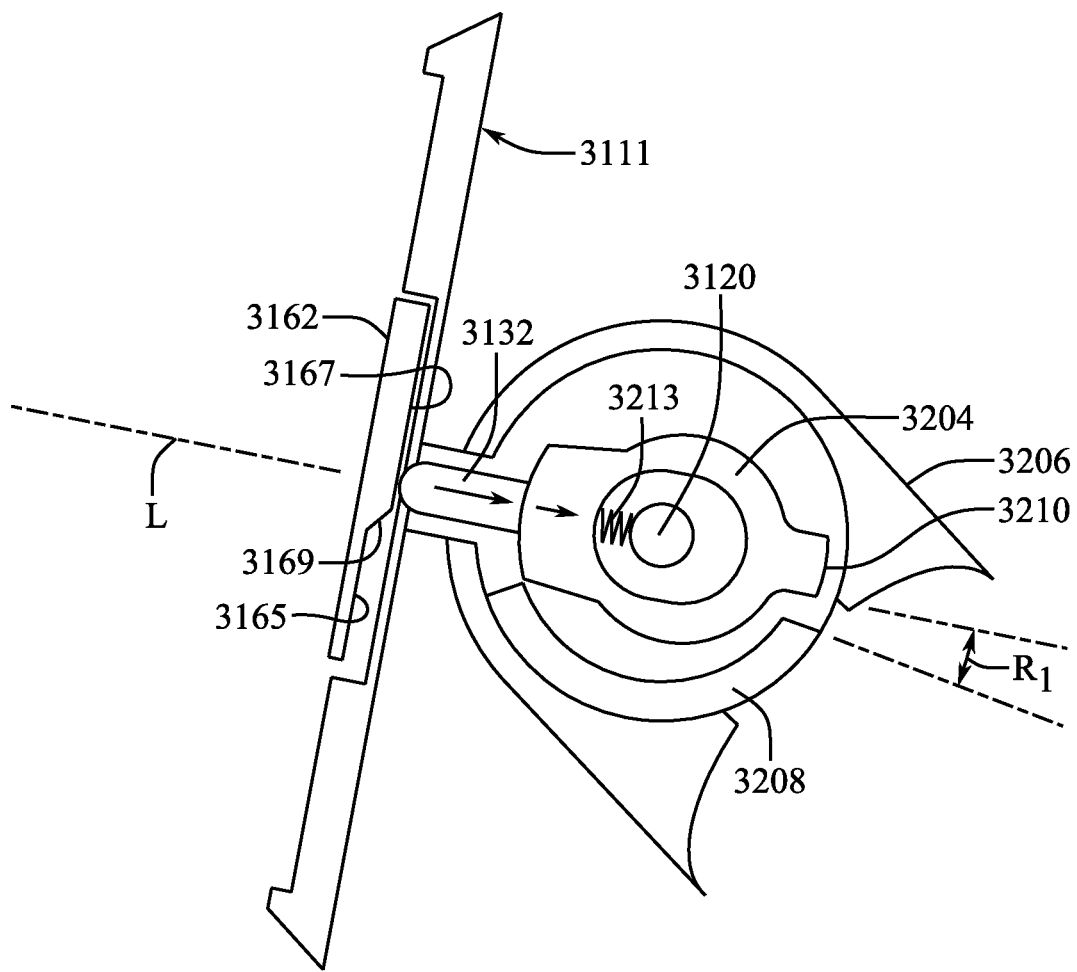
FIG. 34 shows a side section view of the mounting portion and support arm as taken through section lines 34-34 in FIG. 33.

FIG. 33 shows a partial front end view of the mounting portion of FIG. 31 with the mounting portion in an unlocked state. The latches (e.g., 3122) are retracted. The internal pin 3132 is also shown hidden behind the rotatable ring 3162. FIG. 34 shows a side section view of the mounting portion and support arm as taken through the position of section lines 34-34 in FIG. 33. In FIG. 34, the support arm 3104 has been rotated about pivot axis 3120 to a raised position. The block 3208 has therefore been rotated away from the end portion 3210 of the locking member 3204. Freeing the end portion 3210 permits the locking member 3204 to translate relative to the housing 3206 along axis L. Therefore, in the raised position, rotation of the ramped portion 3169 of the rotatable ring 3162 into contact with the internal pin 3132 can drive the internal pin 3132 in an axially rearward direction, thereby driving the locking member 3204 rearward, as shown and indicated by the small axial arrows in FIG. 34. Rotation of the rotatable ring 3162 can permit unlocking of the mounting portion 3111 and removing a display from the mounting portion 3111.

In some embodiments, when the mounting portion 3111 is unlocked, the display can be removed from a first orientation (e.g., landscape) and can be reattached in a second orientation (e.g., portrait). In some embodiments, unlocking the mounting portion 3111 allows the display to be rotated while positioned on the mounting portion 3111 (e.g., while the mounting portion 3111 is within the recess 1400) from one orientation to another. When the rotatable ring 3162 resets to its default/biased locked configuration, the internal pin 3132 can be pushed forward again by a biasing device 3213 at the locking member 3204, thereby returning the rotatable ring 3162, internal pin 3132, and locking member 3204 to their state shown in FIG. 32.

While the rotatable ring 3162 is rotated into the unlocked position, as shown in FIG. 34, the mounting portion 3111 can be rotated about the pivot axis 3120 within a limited angular range of motion indicated by angle $R_1$. Thus, the display can be tilted about the pivot axis 3120 within the same angular range of motion while the mounting portion 3111 is unlocked.

Figure 35:
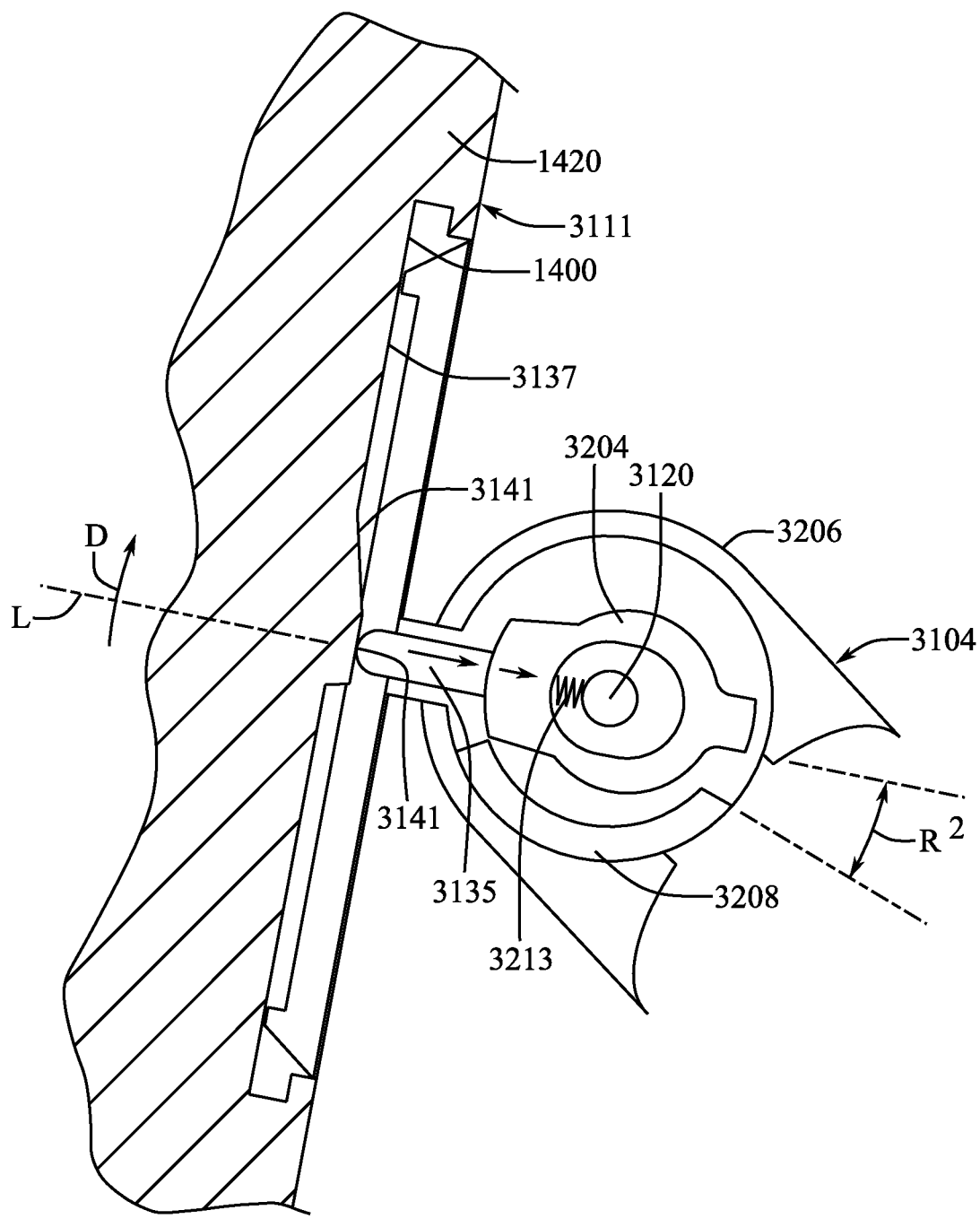
FIG. 35 shows a side section view of the mounting portion and support arm as taken through section lines 35-35 in FIG. 31 and with the mounting portion inserted into a recess of a display housing.

The mounting portion 3111 can comprise a second pin 3135 as shown in FIGS. 31 and 35. FIG. 35 shows a side section view of the mounting portion 3111 and support arm 3104 as taken through the position of section lines 35-35 in FIG. 31 and with the mounting portion inserted into a recess 1400 of a display housing 1420. The second pin 3135 can be biased in a longitudinally forward direction by the locking member 3204 and biasing device 3213 in a manner similar to internal pin 3132. When the display is in a landscape orientation, the second pin 3135 can extend into contact with a first rear surface 3137 of the recess of the display housing. When the display is in a portrait orientation, as shown in FIG. 35, the second pin 3135 can contact a second rear surface 3141 of the display housing that is longitudinally closer to the pivot axis 3120 than the first rear surface 3137. The display housing can include a ramped surface 3141 to allow the second pin 3135 to gradually be pushed longitudinally rearward from the first rear surface 3137 as the display rotates in direction D (see also FIG. 31). The second pin 3135 can push the locking member 3204 rearward, as indicated by the small arrows in the pin 3135 and locking member 3204 in FIG. 35, and the locking member 3204 can therefore prevent the support arm 3104 from moving to a lowered position due to interference with the block 3208. Accordingly, positioning the display in a portrait orientation can prevent the support arm from lowering, thereby preventing the display from coming into contact with a support surface.

The display can be tilted about the pivot axis 3120 while in the portrait orientation within a range of angular motion defined by angle $R_2$. The range of motion of $R_2$ can be greater than the range of motion defined by angle $R_1$. In this manner, the range of motion of angle $R_1$ corresponds to a reduced range of motion possible while the display is transitioned from landscape to portrait (or vice versa). This can help prevent the corner of the display from tilting into contact with a support surface while the display is rotating from landscape to portrait (or vice versa). Thus, the range of motion of tilting can be limited to angle $R_1$ while transitioning between orientations (i.e., while unlocked) and can be limited to the greater angle $R_2$ while locked in portrait orientation. In the locked portrait or landscape orientations, the display does not extend as close to a support surface as when the display is transitioning between orientations. The difference in the size of the space between the angles $R_1$ and $R_2$ can be defined by the shape of the block 3208 or the shape of the locking member 3204 where they come into contact with each other.

Figure 36:
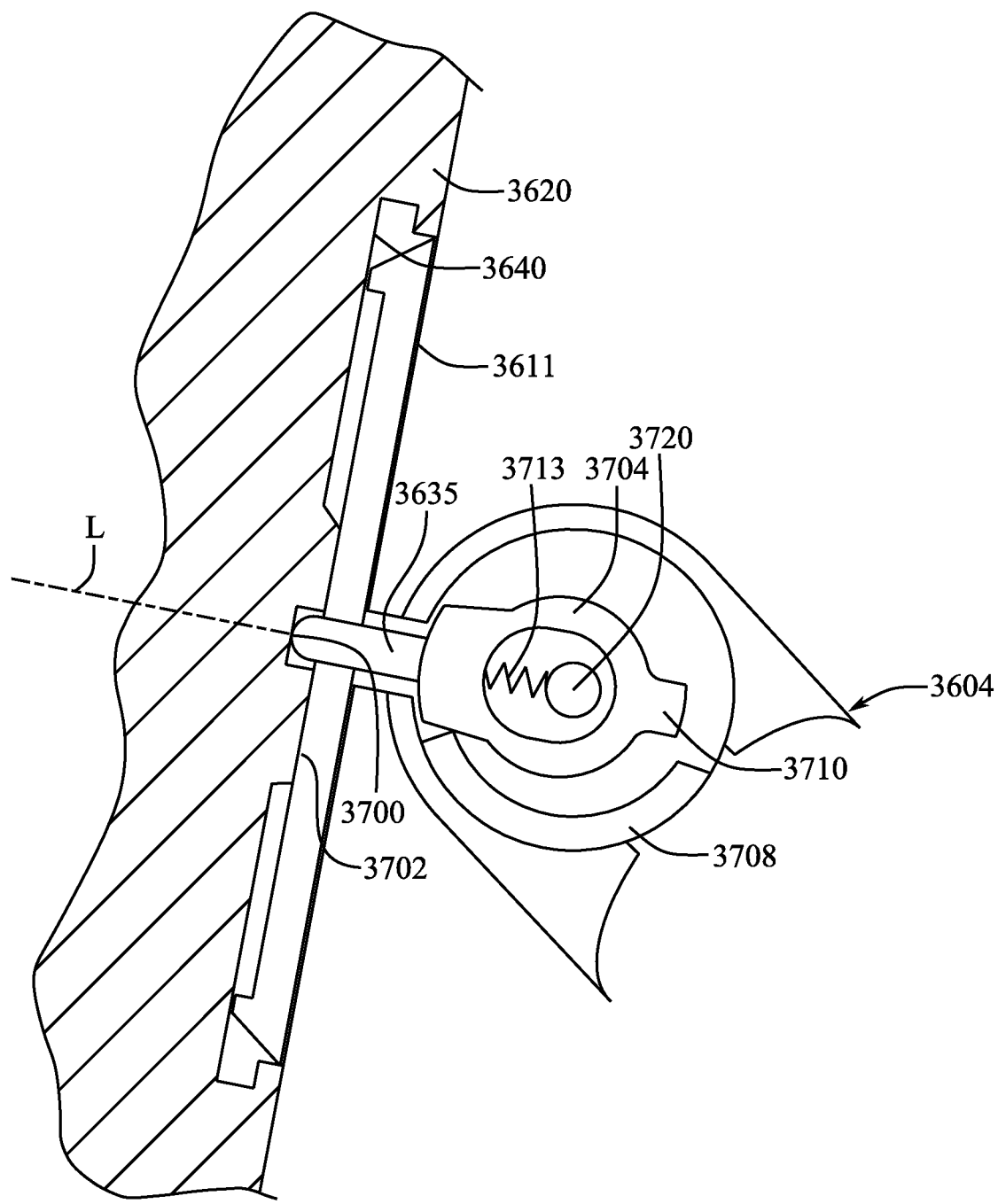
FIG. 36 shows a side section view of the mounting portion and support arm as taken through section lines 35-35 in FIG. 31 and with the mounting portion inserted into a recess of another embodiment of a display housing in a first orientation.
Figure 37:
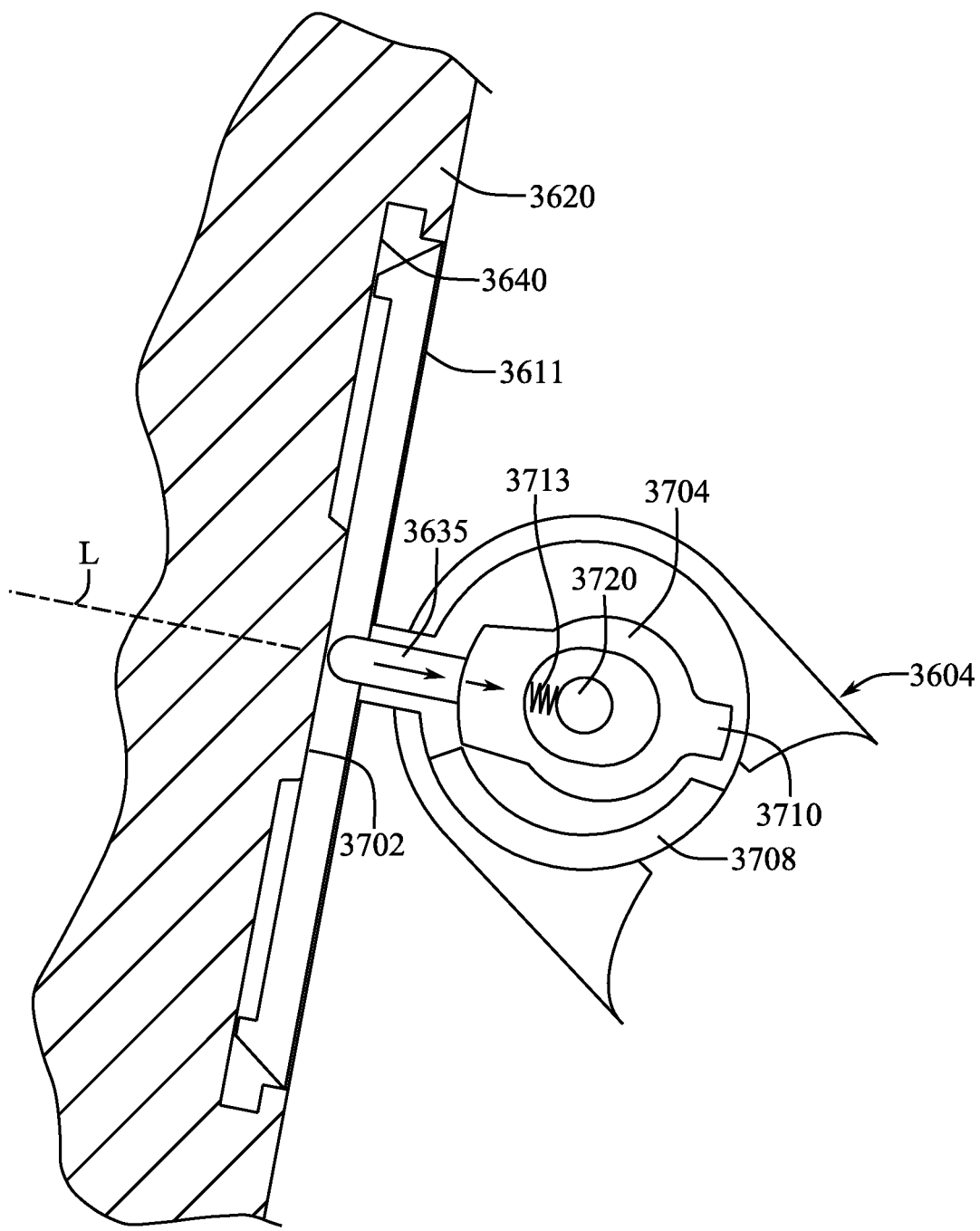
FIG. 37 shows a side section view of the mounting portion and support arm as taken through section lines 35-35 in FIG. 31 and with the mounting portion inserted into a recess of another embodiment of a display housing in a second orientation.

FIGS. 36 and 37 show side section views of an alternate embodiment of a display housing 3620. FIG. 36 shows a side section view of the mounting portion 3611 and support arm 3604 as taken through a section similar to section lines 35-35 in FIG. 31. The mounting portion 3611 is inserted into a recess 3640 of another embodiment of a display housing 3620 that is in a first rotated orientation. In this case, the second pin 3635 is configured to extend into a pin-receiving recess 3700 in a rear-facing surface 3702 of the recess 3640 of the display housing 3620. In this state, the support arm 3604 is freely rotatable about the pivot axis 3720 without the end portion 3710 of locking member 3704 contacting a block 3708 of the housing of the support arm 3604. This first rotated orientation of the display housing 3620 can correspond to a landscape orientation wherein the support arm 3604 can safely move the display up and down without coming into contact with (e.g., crashing into) a support surface. The pin-receiving recess 3700 can be configured to contact the sides of the second pin 3635 if a user attempts to rotate the display housing 3620, thereby limiting or preventing any possible rotation of the display housing 3620 relative to the support arm 3604. The display housing 3620 can therefore not be axially rotatable (e.g., about axis L) while attached to the mounting portion 3611.

FIG. 37 shows a side section view of the mounting portion 3611 and support arm 3604 as taken through a section similar to section lines 35-35 in FIG. 31. The mounting portion 3611 is inserted into a recess 3640 of the display housing 3620 in a second rotated orientation. For example, this rotated orientation can correspond to a portrait orientation. In order to reach this state, the display housing 3620 can be removed from the mounting portion 3611 while in a first orientation (e.g., landscape), can be rotated to the second orientation (e.g., portrait) while removed from the mounting portion 3611, and then can be reattached in the state shown in FIG. 37. As the display housing 3620 is reattached, the second pin 3635 can contact the rear-facing surface 3702 in the recess 3640 and can be pushed longitudinally rearward (e.g., along axis L), as indicated by the arrow in FIG. 37. The rearward movement of the second pin 3635 can push the locking member 3704 rearward to a lockout position wherein the rear end 3710 of the locking member 3704 prevents rotation of the support arm 3604 relative to the display housing 3620 due to mechanical interference between the rear end 3710 and the block 3708, similar to the state shown in FIG. 35.

While in the lockout position, the support arm 3604 can hold up the display in a manner preventing it from moving downward into contact with a support surface. In some embodiments, the display housing 3620 is prevented from rotating back to the first orientation (e.g., landscape) while in this condition unless the display housing 3620 is first removed from the mounting portion 3611 and reattached in the configuration shown in FIG. 36. Upon removal of the display housing 3620 from the configuration shown in FIG. 37, the second pin 3635 can be biased forward to the position shown in FIG. 36 by the locking member 3704 and biasing device 3713, thereby removing the interference between the locking member 3704 and the block 3708.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A display assembly, comprising:
    an electronic display having a display panel and a housing, the display panel being positioned in the housing, the housing having a mounting recess, the mounting recess having a sidewall surface with at least one laterally-extending recess; and
    a support arm configured to support the electronic display relative to a ground surface, the support arm having a mount portion with a set of laterally-extending latches configured to be positioned in the at least one laterally-extending recess to retain the mount portion in the mounting recess of the electronic display, at least one latch of the set of laterally-extending latches being radially retractable relative to the mount portion, the support arm having a release mechanism operable along a non-radial axis relative to the mount portion to radially retract the at least one laterally-extending latch of the set of laterally extending latches, the non-radial axis being parallel to a plane in which the at least one laterally-extending latch retracts.

2. The display assembly of claim 1, further comprising:
    a display stand attached to the support arm at an end of the support arm opposite the mount portion;
    wherein the at least one laterally-extending recess includes a set of laterally-extending recesses in the sidewall surface receiving the set of laterally-extending latches;
    wherein the electronic display further comprises a first magnetic structure and the mount portion comprises a second magnetic structure, the first and second magnetic structures being attracted to each other while the mount portion is positioned in the mounting recess.

3. The display assembly of claim 1, wherein the mount portion is round and the set of laterally-extending latches are circumferentially spaced around the mount portion.

4. The display assembly of claim 1, wherein the at least one latch of the set of laterally-extending latches is biased into an extended position relative to the mount portion.

5. The display assembly of claim 1, wherein the release mechanism comprises a switch configured to retract the at least one latch of the set of laterally-extending latches.

6. The display assembly of claim 1, wherein the electronic display is rotatable relative to the mount portion while the mount portion is retained to the electronic display.

7. The display assembly of claim 6, wherein the electronic display is rotatable from a landscape orientation and a portrait orientation in only one rotational direction.

8. The display assembly of claim 1, wherein the housing comprises a first magnetic structure and the mount portion comprises a second magnetic structure, the first and second magnetic structures being attracted to each other while the mount portion is positioned in the mounting recess.

9. The display assembly of claim 8, wherein the first and second magnetic structures are aligned along an axis, and the first and second magnetic structures each comprise at least one magnetic portion having radially-oriented poles relative to the axis.

10. A display support arm, comprising:
    a first end configured to attach the arm to a support surface;
    a second end configured to attach the arm to a display, the second end including a display-facing surface;
    a first magnetic structure positioned in the second end and having a first magnetic axis perpendicular to the display-facing surface;
    a second magnetic structure positioned in the second end and having a second magnetic axis parallel to the display-facing surface; and
    a third magnetic structure positioned in the second end and having a third magnetic axis, the third magnetic axis being parallel to the display-facing surface and perpendicular to the second magnetic axis.

11. The display support arm of claim 10, wherein the third magnetic structure is positioned opposite the first magnetic structure relative to the second magnetic structure.

12. The display support arm of claim 11, wherein the second and third magnetic structures each comprise an inner end along the respective second and third magnetic axes, wherein polarities of the second and third magnetic structures at the inner ends match.

13. The display support arm of claim 10, wherein the second magnetic axis intersects the first magnetic axis.

14. The display support arm of claim 10, wherein the second magnetic axis extends through a width of the first magnetic structure.

15. The display support arm of claim 10, wherein the display-facing surface comprises a groove or ridge configured to interface a respective ridge or groove of the display.

16. The display support arm of claim 15, wherein the groove or ridge has an overall width across the display-facing surface, the overall width of the groove or ridge being greater than an overall width of the first and second magnetic structures.

17. A monitor assembly, comprising:
   a stand;
   a support arm being pivotally attached to the stand, the support arm being rotatable relative to the stand between a raised position and a lowered position, the support arm having a monitor mount portion; and
   a monitor being pivotally attached to the monitor mount portion, the monitor being rotatable relative to the support arm so as to permit rotation of the monitor from a landscape orientation to a portrait orientation while the support arm is in the raised position, prevent rotation of the monitor from the landscape orientation to the portrait orientation while the support arm is in the lowered position, and prevent rotation of the support arm relative to the stand while the monitor is in the portrait orientation.

18. The monitor assembly of claim 17, wherein a pin-and-slot feature of the support arm and the monitor prevents rotation of the monitor relative to the support arm.

19. The monitor assembly of claim 17, wherein rotation of the monitor to the portrait orientation prevents rotation of the support arm relative to the stand.

20. The monitor assembly of claim 17, wherein the monitor is disconnectable from the monitor mount portion.

* * * * *